(12) United States Patent
Bae et al.

(10) Patent No.: US 9,846,754 B2
(45) Date of Patent: Dec. 19, 2017

(54) METHOD OF FABRICATING SEMICONDUCTOR DEVICE

(71) Applicant: Samsung Electronics Co., Ltd., Suwon-si, Gyeonggi-do (KR)

(72) Inventors: Sungmin Bae, Hwaseong-si (KR); Tae-Il Kim, Goyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/079,640

(22) Filed: Mar. 24, 2016

(65) Prior Publication Data

US 2017/0039300 A1    Feb. 9, 2017

(30) Foreign Application Priority Data

Aug. 6, 2015   (KR) .................. 10-2015-0111190

(51) Int. Cl.
   *G06F 17/50*   (2006.01)
(52) U.S. Cl.
   CPC .................. *G06F 17/505* (2013.01)
(58) Field of Classification Search
   CPC ................................... G06F 17/505
   USPC ..................... 716/50, 55, 100, 103
   See application file for complete search history.

(56) References Cited

U.S. PATENT DOCUMENTS

| | | | |
|---|---|---|---|
| 6,934,924 B2 * | 8/2005 | Paul et al. | G06F 17/5068 716/114 |
| 8,239,806 B2 | 8/2012 | Chen et al. | |
| 8,261,214 B2 | 9/2012 | Maeda et al. | |
| 8,677,292 B2 | 3/2014 | Fu et al. | |
| 8,782,586 B2 | 7/2014 | Sezginer et al. | |
| 8,935,639 B1 | 1/2015 | Tzeng | |
| 2013/0205266 A1 | 8/2013 | Chen et al. | |
| 2014/0053118 A1 | 2/2014 | Chen et al. | |
| 2014/0282293 A1 | 9/2014 | Lin et al. | |
| 2017/0032074 A1 * | 2/2017 | Song ................. H01L 21/76877 |

FOREIGN PATENT DOCUMENTS

| | | |
|---|---|---|
| JP | 2783216 B2 | 8/1998 |
| JP | 2001-326282 A | 11/2001 |
| JP | 2012-27861 | 2/2012 |

* cited by examiner

*Primary Examiner* — Sun Lin
(74) *Attorney, Agent, or Firm* — Harness, Dickey & Pierce, PLC

(57) ABSTRACT

A semiconductor device can be manufactured based on patterning groups to include a metal layer patterned according to separate patterning groups. The patterning groups are based on a layout pattern. Preparing the layout pattern includes selecting a first power pattern and a second power pattern, selecting a first pattern and a second pattern therebetween, and selecting a tie-connection pattern to connect the first power pattern to the first pattern. The manufacturing includes forming metal lines according to the patterning groups. Photomasks are manufactured according to the layout pattern, and the metal lines are formed according to the photomasks. A first photomask is manufactured based on the first power pattern and the second power pattern, the first pattern, and the tie-connection pattern, and a second photomask is manufactured based on the second pattern.

20 Claims, 35 Drawing Sheets

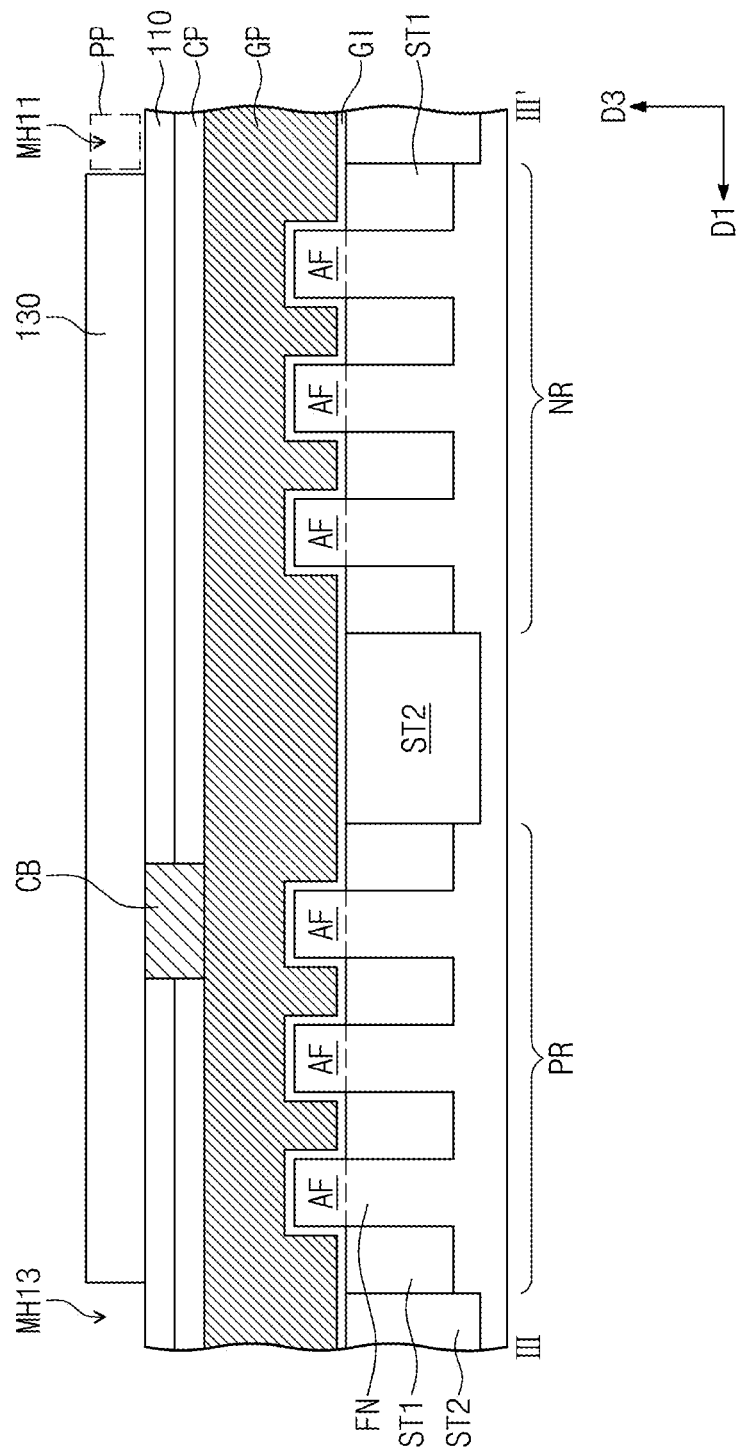

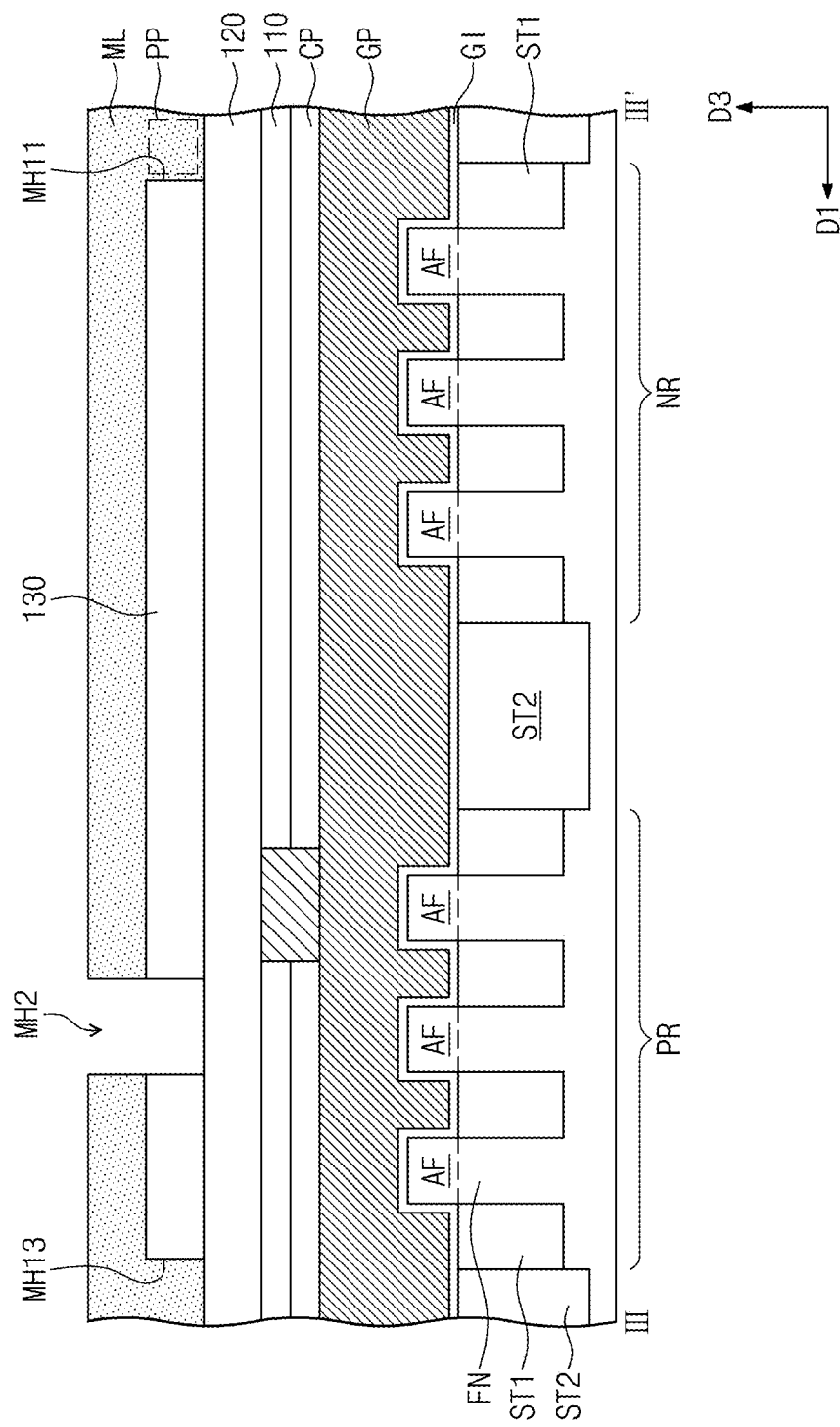

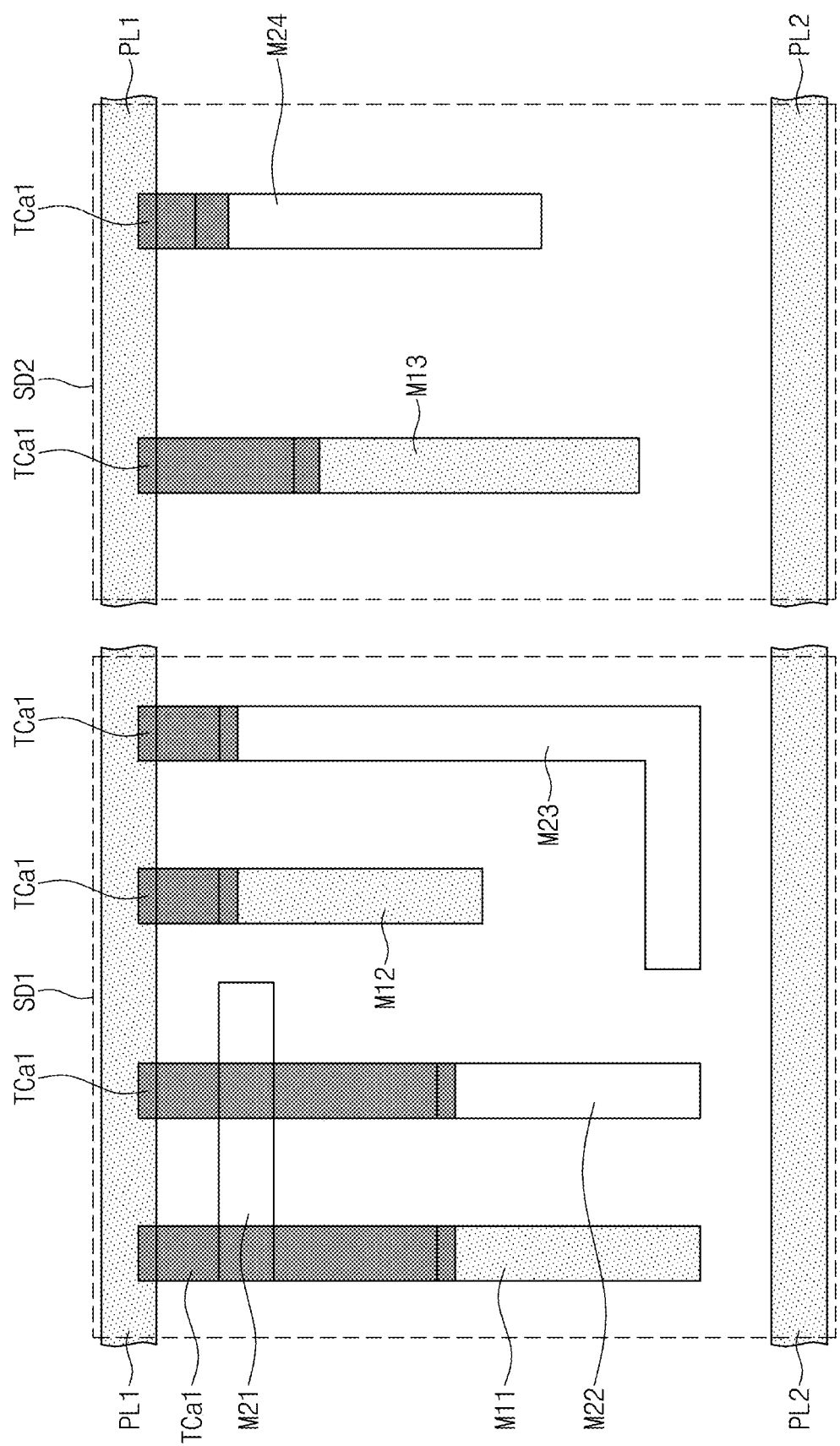

METHOD OF FABRICATING SEMICONDUCTOR DEVICE

CROSS-REFERENCE TO RELATED APPLICATIONS

This U.S. non-provisional patent application claims priority under 35 U.S.C. §119 to Korean Patent Application No. 10-2015-0111190, filed on Aug. 6, 2015, in the Korean Intellectual Property Office, the entire contents of which are hereby incorporated by reference.

BACKGROUND OF THE INVENTION

Example embodiments of the inventive concepts relate to manufacturing a semiconductor device, and in particular to designing a layout of a semiconductor device including a field effect transistor and manufacturing a semiconductor device using the same.

Due to their small-sized, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with fast speed and/or low power consumption, semiconductor devices with high reliability, high performance, and/or multiple functions may be developed. To develop such semiconductor devices, complexity and/or integration density of semiconductor devices are being increased.

SUMMARY

Example embodiments of the inventive concepts provide methods of preparing a layout for a first metal layer and of manufacturing a semiconductor device using the layout. In some example embodiments the layout may be prepared to connect input and power patterns constituting the first metal layer to each other in a tie-connection manner.

According to some example embodiments of the inventive concepts, a method of manufacturing a semiconductor device may include preparing a layout pattern, manufacturing first and second photomasks, and forming one or more metal lines on a substrate according to the first and second photomasks. The preparing of the layout pattern may include selecting first and second power patterns, selecting first and second patterns therebetween, and selecting a tie-connection pattern connecting the first power pattern to the first pattern. The first photomask may be manufactured based on the first and second power patterns, the first pattern, and the tie-connection pattern, and the second photomask may be manufactured based on the second pattern.

In some example embodiments, at least one of the metal lines may include a power interconnection portion, a metal interconnection portion, and a tie interconnection portion that are connected to form a single body. In some example embodiments a position and shape of each of the power interconnection portion, the metal interconnection portion, and the tie interconnection portion may be at least partially defined by the first power pattern, the first pattern, and the tie-connection pattern, respectively.

In some example embodiments, the first pattern may be configured to define an input pattern to which an input signal is applied.

In some example embodiments, the tie-connection pattern may include a geodesic connection of the first power pattern to the first pattern.

In some example embodiments, the preparing of the layout pattern may further include preparing back-annotation information indicating tie-connection availability between the first and second patterns and the first and second power patterns.

In some example embodiments, the preparing of the back-annotation information may include identifying first preliminary tie-connection patterns to connect the first power pattern to the first and second patterns, respectively, identifying second preliminary tie-connection patterns configured to connect the second power pattern to the first and second patterns, respectively, performing a design rule check on the first and second preliminary tie-connection patterns, and excluding one of the first and second preliminary tie-connection patterns from the back-annotation information based on a determination that the one of the first and second preliminary tie-connection patterns violates at least one design rule.

In some example embodiments, the back-annotation information may include first information indicating that the first pattern is configured to be connected to the first power pattern by at least one tie connection pattern. The tie-connection pattern may be selected based on the first information.

In some example embodiments, the back-annotation information may include first information indicating that the first pattern is configured to be connected to the first power pattern by at least one tie connection pattern and second information indicating that the second pattern is restricted from being connected to the first power pattern by at least one tie connection pattern. The first and the second patterns may be input patterns and may be functionally equivalent to each other. The selecting of the tie-connection pattern may include determining whether the second pattern is a first input pattern configured to be connected to the first power pattern, and then, selecting the tie-connection pattern to connect the first power pattern to the first pattern, based on the back-annotation information, such that the first pattern is assigned to a second input pattern, the second input pattern being functionally equivalent to the first input pattern.

In some example embodiments, the first and second power patterns and the second pattern may be included in a first patterning group associated with manufacturing the first photomask, the first pattern may be included in a second patterning group associated with manufacturing the second photomask, and the back-annotation information may include third information indicating that the first pattern is restricted from being connected to the first power pattern by at least one tie connection pattern. The selecting of the tie-connection pattern may include determining whether the first pattern is an input pattern configured to be connected to the first power pattern, converting the first pattern from the second patterning group to the first patterning group, based on the back-annotation information, and converting the second pattern from the first patterning group to the second patterning group, based on the back-annotation information.

In some example embodiments, the method may further include, prior to forming the metal lines, patterning the substrate to define an active pattern, forming a gate pattern that crosses the active pattern, and forming source/drain regions on the active pattern and at opposite sides of the gate pattern. At least two of the metal lines may be electrically connected to the gate pattern and the source/drain region, respectively.

According to some example embodiments of the inventive concepts, a method of manufacturing a semiconductor device may include preparing a layout pattern for a first metal layer, and forming metal lines on a substrate, the metal lines having positions and shapes defined by the layout pattern for the first metal layer. The preparing of the layout pattern for the first metal layer may include selecting a pair of power patterns, selecting a plurality of patterns between the power patterns, selecting a tie-connection pattern to connect at least one of the power patterns to at least one of the patterns, the pair of the power patterns, the at least one of the patterns, and assigning the pair of the power patterns the at least one of the patterns, and the tie connection pattern to a first patterning group.

In some example embodiments, the forming of the metal lines may include performing a patterning process according to first and second photomasks, and the first photomask may be manufactured based on the first patterning group.

In some example embodiments, the preparing of the layout pattern for the first metal layer may further include preparing back-annotation information indicating tie-connection availability between the plurality of patterns and the pair of power patterns.

In some example embodiments, the selecting of the tie-connection pattern may include determining a connection relationship criterion, based on the back-annotation information, and selecting the tie-connection pattern if a connection relationship between an input pattern of the plurality of patterns and the pair of power patterns at least meets the connection relationship criterion defined.

In some example embodiments, the selecting of the tie-connection pattern may include determining a connection relationship criterion, based on the back-annotation information, and, if a connection relationship of an input pattern of the plurality of patterns does not meet the connection relationship criterion, performing at least one of, replacing the input pattern with another pattern of the plurality of patterns, and assigning the input pattern to the first patterning group.

According to some example embodiments of the inventive concepts, a method of designing a layout may include preparing a layout pattern for manufacturing a semiconductor device. The preparing of the layout pattern may include selecting first and second power patterns, selecting first and second patterns therebetween, and selecting a tie-connection pattern connecting the first power pattern to the first pattern. In some example embodiments, the first and second power patterns, the first pattern, and the tie-connection pattern may be a first patterning group, and the second pattern may be a second patterning group. The first and second patterning groups may be used to manufacture different photomasks, respectively.

In some example embodiments, the preparing of the layout pattern may further include preparing back-annotation information on tie-connection availability between the first and second patterns and the first and second power patterns.

In some example embodiments, the back-annotation information may be prepared to include first information indicating that the first pattern is configured to connect the first power pattern by at least one tie connection pattern. The selecting of the tie-connection pattern may include determining whether the first pattern is an input pattern configured to be connected to the first power pattern, and then, selecting the tie-connection pattern, based on the back-annotation information.

In some example embodiments, the back-annotation information may be prepared to include first information indicating that first pattern is configured to be connected to the first power by at least one tie connection pattern and second information indicating that the second pattern is restricted from being connected to the first power pattern by at least one tie connection pattern. The first and the second patterns may be input patterns, to which an input signal is applied, and may be functionally equivalent to each other. The selecting of the tie-connection pattern may include determining whether the second pattern is a first input pattern configured to be connected to the first power pattern, and then, selecting the tie-connection pattern such that a functionally-equivalent one of the first patterns, instead of the second pattern, is assigned to a second input pattern, based on the back-annotation information.

In some example embodiments, the back-annotation information may be prepared to include third information indicating that the first pattern and the first connection pattern are included in different patterning groups and thus the first pattern is restricted from being connected to the first power pattern by at least one tie connection pattern. The selecting of the tie-connection pattern may include determining whether the first pattern is an input pattern configured to be connected to the first power pattern, assigning the first pattern to the first patterning group, based on the back-annotation information, and selecting the tie-connection pattern.

According to some example embodiments of the inventive concepts, a method of manufacturing a semiconductor device may include forming at least one insulating layer on a substrate, forming at least first and second sets of metal interconnection holes in the at least one insulating layer according to separate, respective first and second patterning groups, and filling the first and second sets of metal interconnection holes with at least one conductive material to form metal lines according to the first and second patterning groups. The first patterning group may include first and second power patterns, a first pattern between the first and second power patterns, and a tie-connection pattern configured to connect the first power pattern to the first pattern. The second patterning group may include a second pattern between the first and second power patterns.

In some example embodiments, the method may include forming the first and second sets of metal interconnection holes according to first and second photomasks, the first photomask being based on the first patterning group, the second photomask being based on the second patterning group.

In some example embodiments, at least one of the metal lines may include a power interconnection portion, a metal interconnection portion, and a tie interconnection portion that are connected to form a single body; and a position and a shape of each of the power interconnection portion, the metal interconnection portion, and the tie interconnection portion may be at least partially defined by the first power pattern, the first pattern, and the tie-connection pattern, respectively.

In some example embodiments, the first pattern may be configured to define an input pattern to which an input signal is applied.

In some example embodiments, the tie-connection pattern may include a geodesic connection of the first power pattern to the first pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 5C, FIG. 7C, FIG. 9C, and FIG. 11C are sectional views along line III-III' of FIG. 4, FIG. 6, FIG. 8, and FIG. 10, respectively.

FIG. 16A, FIG. 16B, FIG. 17A, and FIG. 17B are plan views illustrating a back-annotation operation on the layout of FIG. 15, according to some example embodiments of the inventive concepts.

Figure 1:
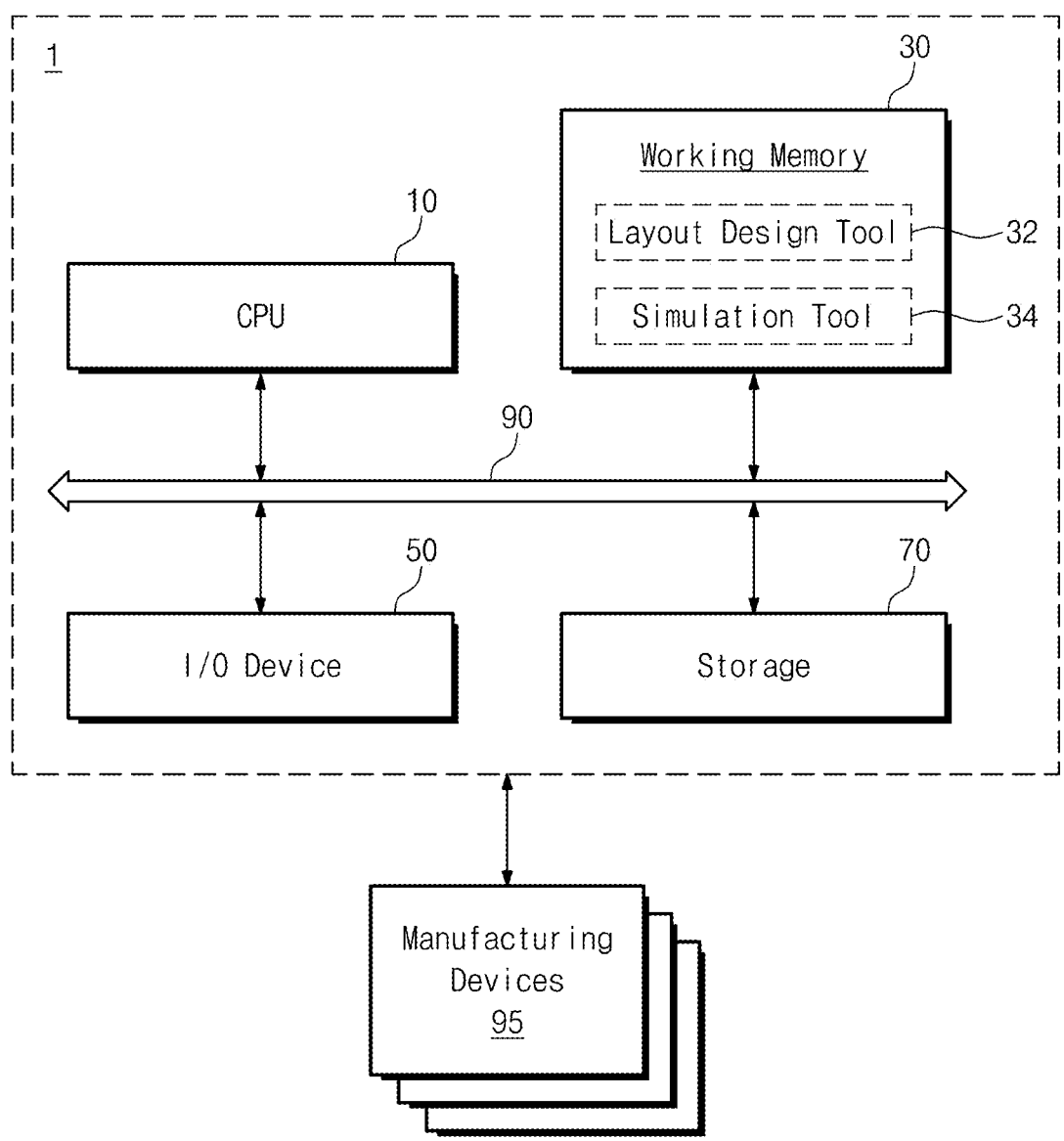
FIG. 1 is a block diagram illustrating a computer system for performing a semiconductor design process, according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

FIG. 1 is a block diagram illustrating a computer system 1 for performing a semiconductor design process, according to some example embodiments of the inventive concepts. A computer system 1 may include a computer processing device. Referring to FIG. 1, a computer system 1 may include a central processing unit (CPU) 10, a working memory 30, an input-output device 50, and a storage device 70. In example embodiments, the computer system 1 may be provided in the form of a customized system for performing a layout design process according to some example embodiments of the inventive concepts. Furthermore, the computer system 1 may include a computing system configured to carry out various design and check simulation programs.

The CPU 10 may be configured to run a variety of instances of software, such as application programs, operating systems, and device drivers. For example, the CPU 10 may be configured to run an operating system (not shown) loaded on the working memory 30. Further, the CPU 10 may be configured to run various application programs on the operating system. For example, the CPU 10 may be configured to run a layout design tool 32 loaded on the working memory 30.

The operating system or application programs may be loaded on the working memory 30. For example, when the computer system starts a booting operation, an OS image (not shown) stored in the storage device 70 may be loaded on the working memory 30 according to a booting sequence. In the computer system 1, overall input/output operations may be managed by the operating system. Similarly, some application programs, which may be selected by a user or be provided for basic services, may be loaded on the working memory 30. According to some example embodiments of the inventive concepts, the layout design tool 32 prepared for a layout design process may be loaded on the working memory 30, from the storage device 70.

The layout design tool 32 may provide a function for changing biasing data for specific layout patterns; for example, the layout design tool 32 may be configured to allow the specific layout patterns to have shapes and positions different from those defined by a design rule. The layout design tool 32 may be configured to perform a design rule check (DRC) under the changed condition of the biasing data. The working memory 30 may be one of volatile memory devices (e.g., static random access memory (SRAM) or dynamic random access memory (DRAM) devices) or nonvolatile memory devices (e.g., PRAM, MRAM, ReRAM, FRAM, NOR FLASH memory devices).

In addition, a simulation tool 34 may be loaded in the working memory 30 to perform an optical proximity correction (OPC) operation on the designed layout data.

The input-output device 50 may be configured to control user input and output operations of user interface devices. For example, the input-output device 50 may include a keyboard or a monitor, allowing a designer to input relevant information. By using the input-output device 50, the designer may receive information on a semiconductor region or data paths, to which adjusted operating characteristics will be applied. The input-output device 50 may be configured to display a progress status or a process result of the simulation tool 34.

The storage device 70 may serve as a storage medium for the computer system. The storage device 70 may be configured to store application programs, an OS image, and various data. The storage device 70 may be provided in the form of one of memory cards (e.g., MMC, eMMC, SD, MicroSD, and so forth) or a hard disk drive (HDD). The storage device 70 may include a NAND FLASH memory device with a large memory capacity. Alternatively, the storage device 70 may include at least one of next-generation nonvolatile memory devices (e.g., PRAM, MRAM, ReRAM, or FRAM) or NOR FLASH memory devices.

A system interconnector 90 may be provided to serve as a system bus for realizing a network in the computer system. The CPU 10, the working memory 30, the input-output device 50, and the storage device 70 may be electrically connected to each other through the system interconnector 90, and thus, data may be exchanged therebetween. However, the system interconnector 90 may not be limited to the afore-described configuration; for example, it may further include an additional element for increasing efficiency in data communication.

In some example embodiments, the computer system 1 is communicatively coupled to one or more manufacturing devices 95. The one or more manufacturing devices 95 may be configured implement one or more elements of manufacturing a semiconductor device. For example, the one or more manufacturing devices 95 may include a photomask manufacturing device configured to manufacture a photomask by patterning a chromium layer provided on a glass substrate. In another example, the one or more manufacturing devices 95 may include one or more devices configured to implement exposing and etching steps to sequentially form patterns on a semiconductor substrate. The computer system 1 may control one or more manufacturing devices 95 to implement one or more elements of a manufacturing process to at least partially manufacture a semiconductor device.

Figure 2:
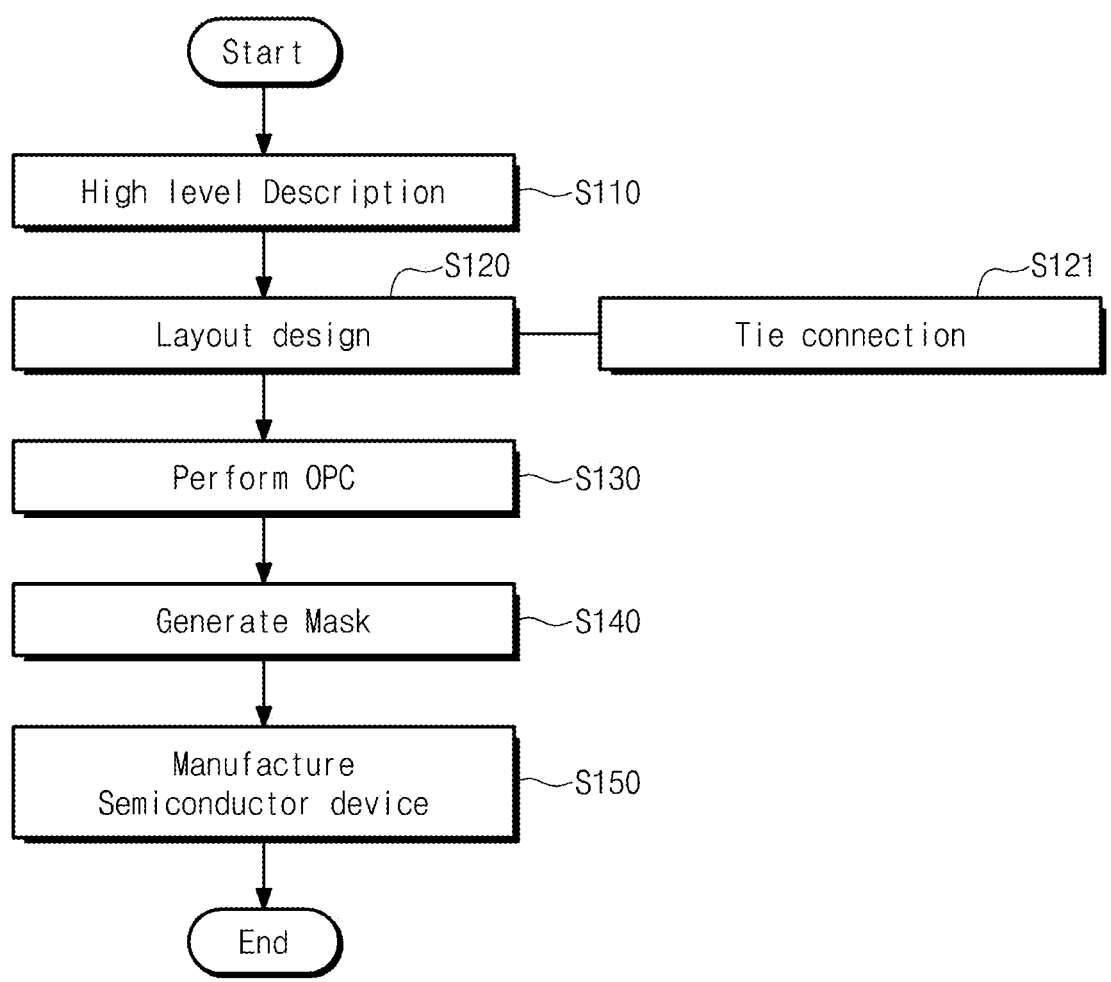
FIG. 2 is a flow chart illustrating a method of designing and manufacturing a semiconductor device, according to some example embodiments of the inventive concepts.

FIG. 2 is a flow chart illustrating a method of designing and manufacturing a semiconductor device, according to some example embodiments of the inventive concepts. The method may be implemented using the computer system 1 described with reference to FIG. 1.

Referring to FIG. 2, the computer system 1 may perform a high-level design process for a semiconductor integrated circuit (in S110). For example, in the high-level design process, an integrated circuit to be designed may be described in terms of high-level computer language (e.g., C language). Circuits designed by the high-level design process may be more concretely described by a register transfer level (RTL) coding or a simulation. Further, codes generated by the RTL coding may be converted into a netlist, and the results may be combined with each other to wholly describe a semiconductor device. The combined schematic circuit may be verified by a simulation tool. In certain embodiments, an adjusting step may be further performed, in consideration of a result of the verification step.

At S120, the computer system 1 may perform a layout design process to realize a logically complete form of the semiconductor integrated circuit on a silicon wafer. For example, the layout design process may be performed in consideration of the schematic circuit prepared in the high-level design process or the corresponding netlist. The layout design process may include a routing step of placing and connecting several cells provided from a cell library, based on a desired (or, alternatively, predetermined) design rule. The layout design process according to some example embodiments of the inventive concepts may include a biasing step of extracting information on at least one via (e.g., risk vias) of the via patterns, which are likely to have a process risk, and then adjusting positions thereof.

In some example embodiments, the computer system 1 performing the layout design process at S120 may include the computer system 1 performing a tie-connection operation S121. For example, the tie-connection operation S121 may be performed to establish a connection path between a power pattern and an input pattern, which is provided in the standard cell and is applied with an input signal, using a tie-connection pattern TC. The tie-connection operation will be described in more detail below.

The cell library may contain information on operation, speed, and power consumption of cells. Furthermore, according to some example embodiments of the inventive concepts, the cell library may include back-annotation information on tie-connection availability. The tie-connection operation S121 may be performed using the tie-connection availability information that is included in the back-annotation.

In certain embodiments, a cell library for representing a layout of a circuit in a gate level may be defined in the layout design tool. In some example embodiments the layout may be prepared to define or describe shapes, positions, or dimensions of patterns constituting transistors and metal lines, which will be actually formed on a silicon wafer. For example, in order to actually form an inverter circuit on a silicon wafer, performing operation S120 may include preparing or drawing a layout for patterns (e.g., PMOS, NMOS, N-WELL, gate electrodes, and metal lines thereon). For this, suitable one(s) of inverters in the cell library may be selected. Thereafter, a routing step of connecting the selected cells to each other may be performed. These steps may be automatically or manually performed in the layout design tool.

After the routing step, a verification step may be performed on the layout to check whether there is a portion violating a given design rule. In some example embodiments, the verification step may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

At S130, the computer system 1 may perform an optical proximity correction (OPC) step. The OPC step may be performed to correct optical proximity effects, which may occur when a photolithography process is performed on a silicon wafer using a photomask manufactured based on the layout. The optical proximity effect may be an unintended optical effect (such as refraction or diffraction) which may occur in the exposing process using the photomask manufactured based on the layout. In the OPC step, the layout may be modified to have a reduced difference in shape between designed patterns and actually-formed patterns, which may be caused by the optical proximity effects. As a result of the optical proximity correction step, the designed shapes and positions of the layout patterns may be slightly changed.

At S140, the computer system 1 may control one or more manufacturing devices 95 to manufacture a photomask, based on the layout modified by the OPC step. In general, the photomask may be manufactured by patterning a chromium layer provided on a glass substrate, using the layout pattern data.

At S150, the computer system 1 may control one or more manufacturing devices 95 to use the manufactured photomask to manufacture a semiconductor device. In the actual manufacturing process, the exposing and etching steps may be repeatedly performed, and thus, patterns defined in the layout design process may be sequentially formed on a semiconductor substrate.

Figure 3A:
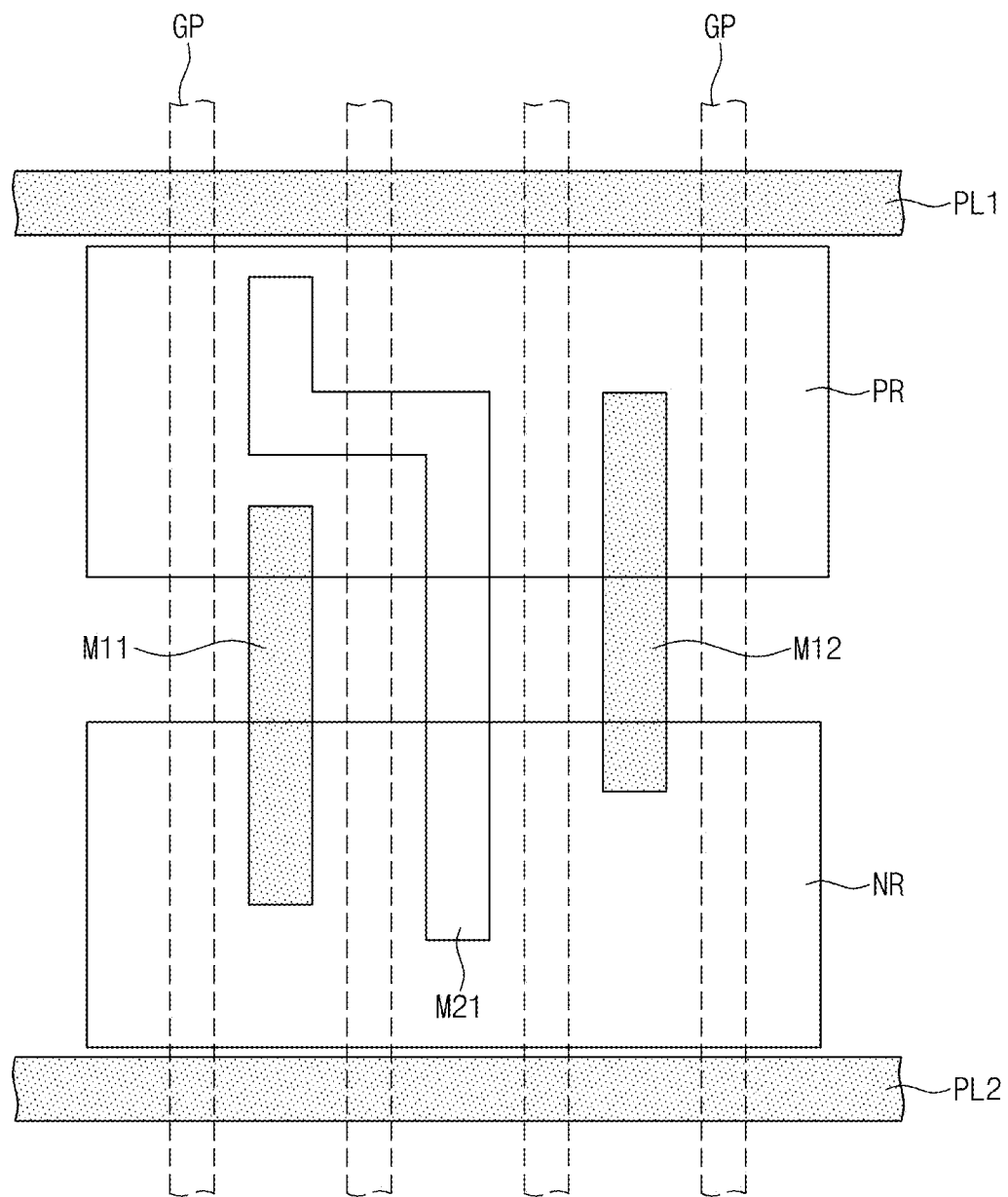
FIG. 3A and FIG. 3B are plan views provided to illustrate layout patterns and to describe a method of designing a layout for a first metal layer, according to some example embodiments of the inventive concepts.
Figure 3B:
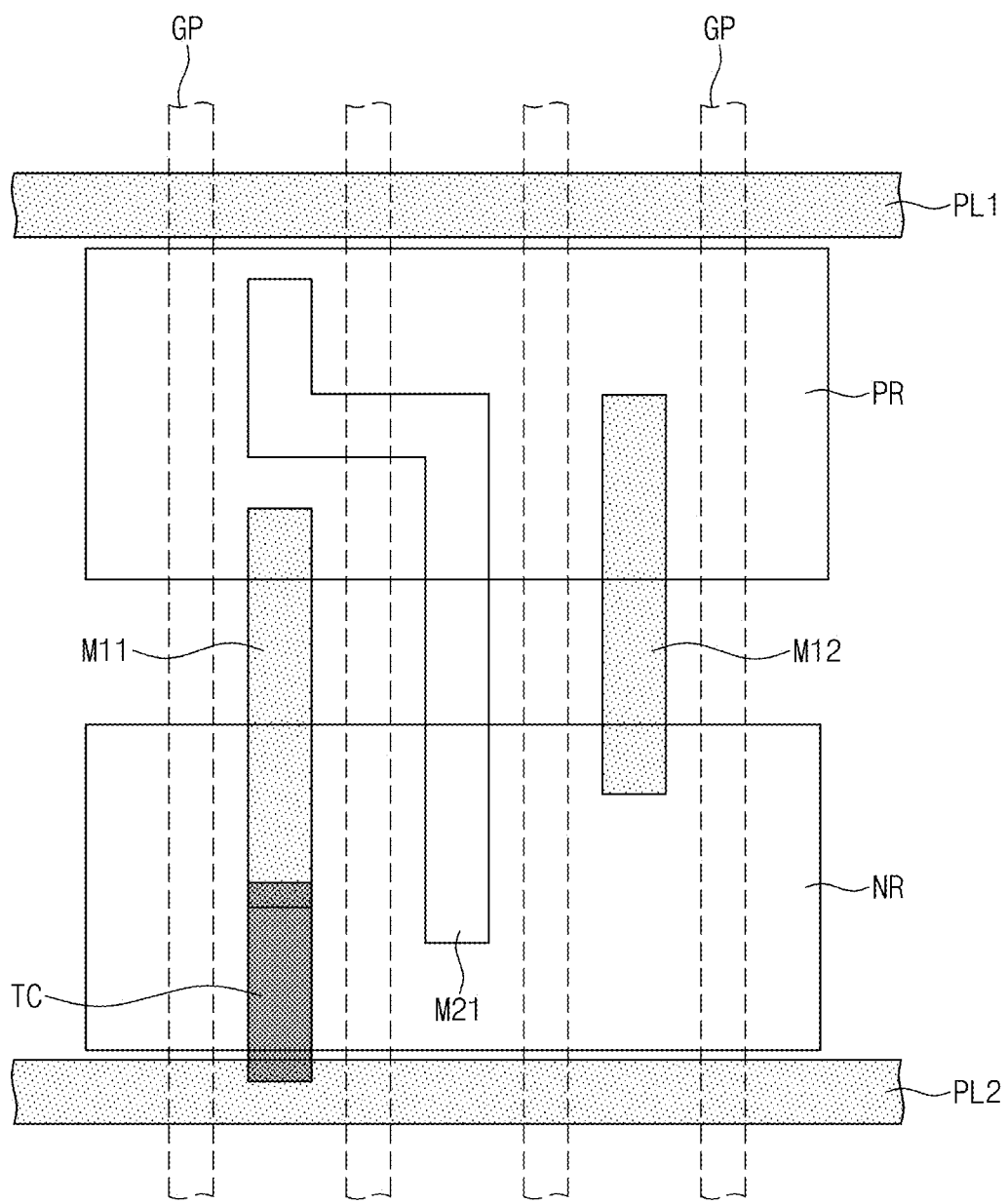
Figure 4:
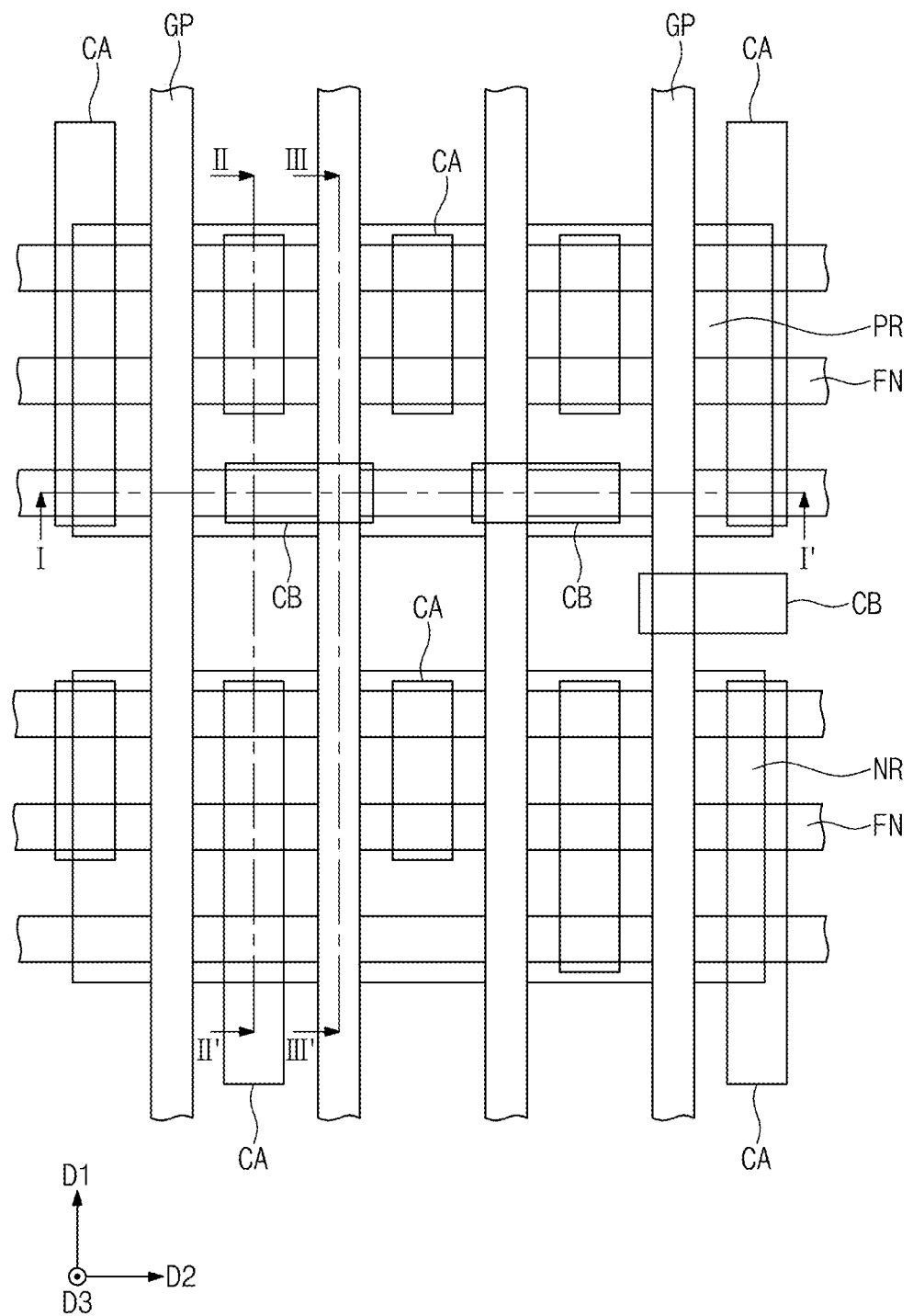
FIG. 4, FIG. 6, FIG. 8, and FIG. 10 are plan views illustrating a process of manufacturing a semiconductor device, according to some example embodiments of the inventive concepts.
Figure 5A:
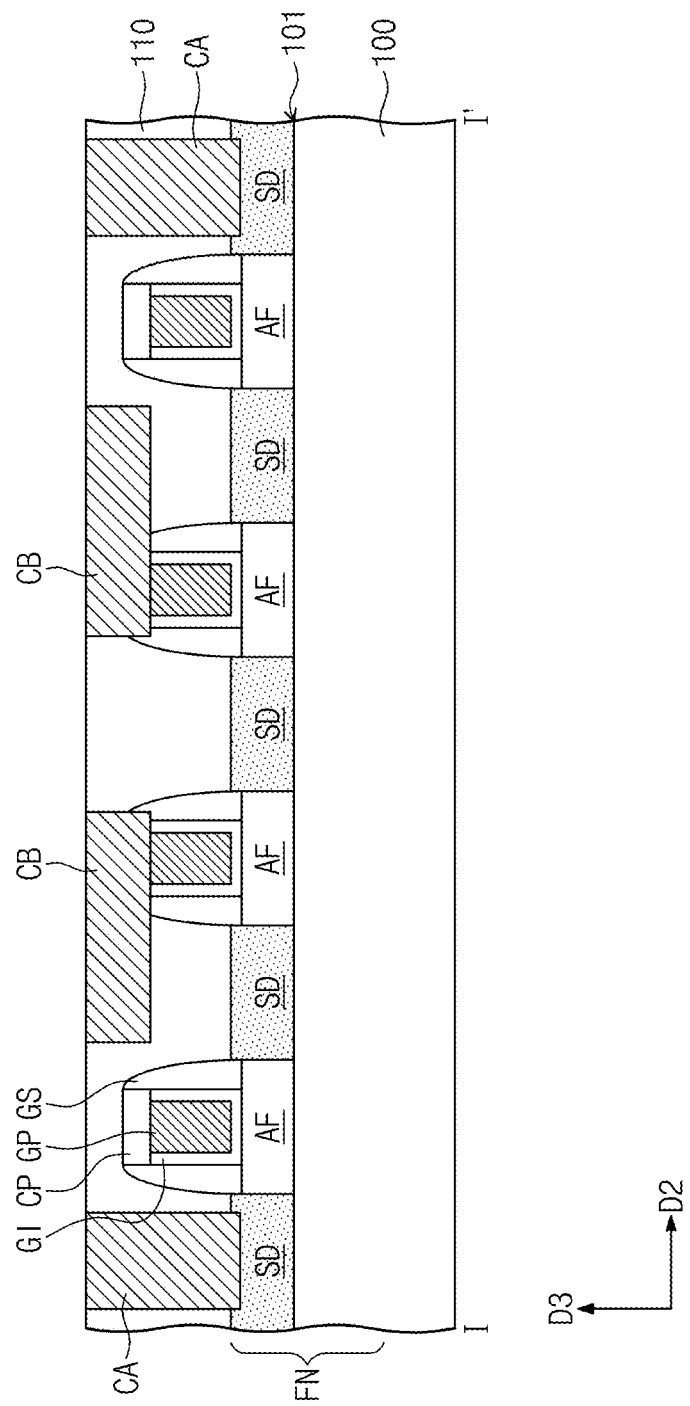
FIG. 5A, FIG. 7A, FIG. 9A, and FIG. 11A are sectional views along line I-I' of FIG. 4, FIG. 6, FIG. 8, and FIG. 10, respectively.
Figure 5B:
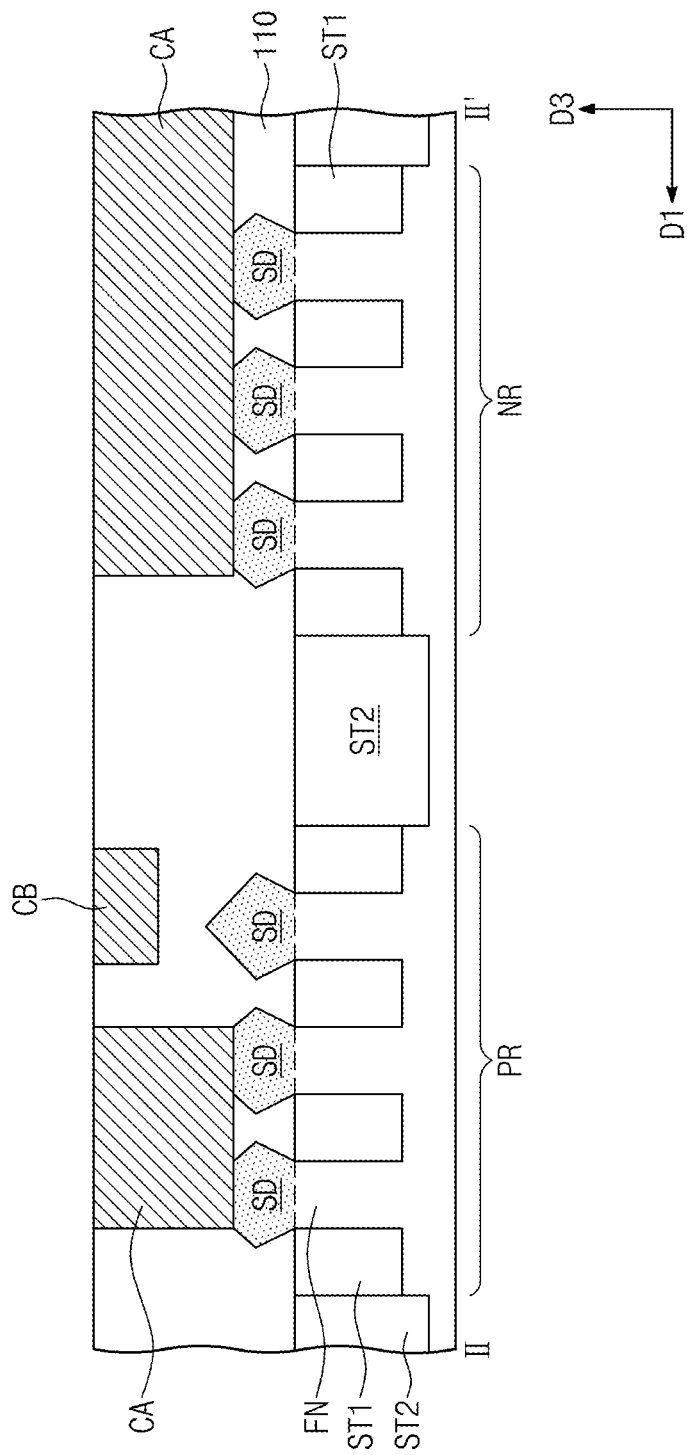
FIG. 5B, FIG. 7B, FIG. 9B, and FIG. 11B are sectional views along line II-II' of FIG. 4, FIG. 6, FIG. 8, and FIG. 10, respectively.
Figure 5C:
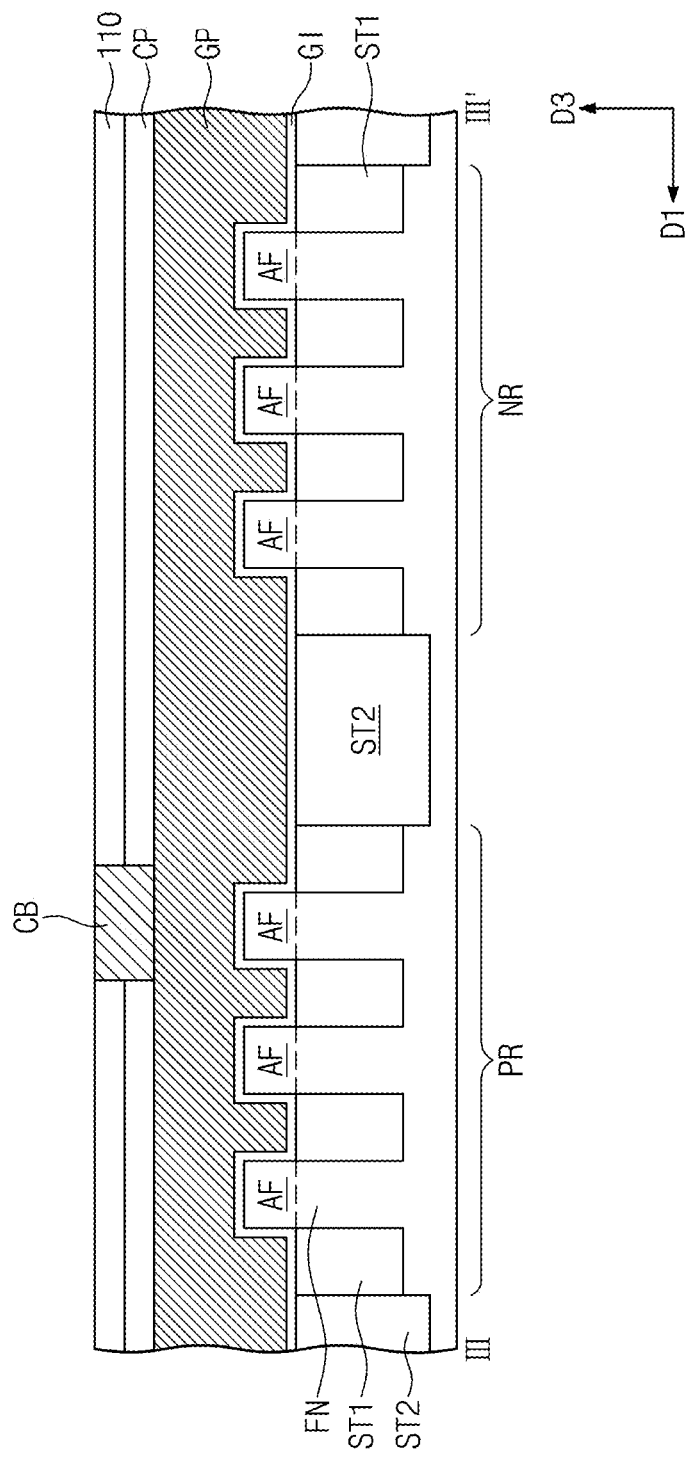
Figure 6:
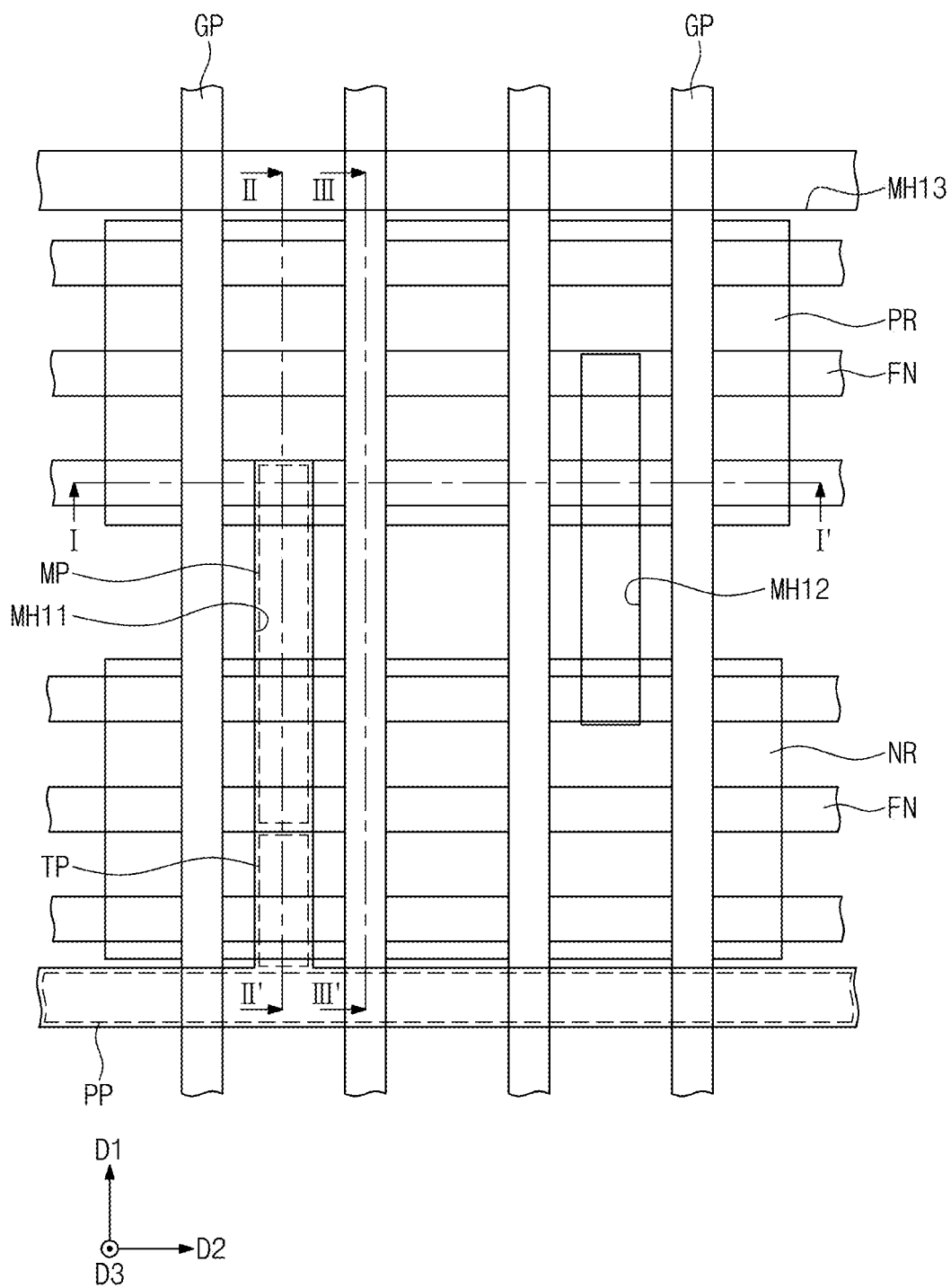
Figure 7A:
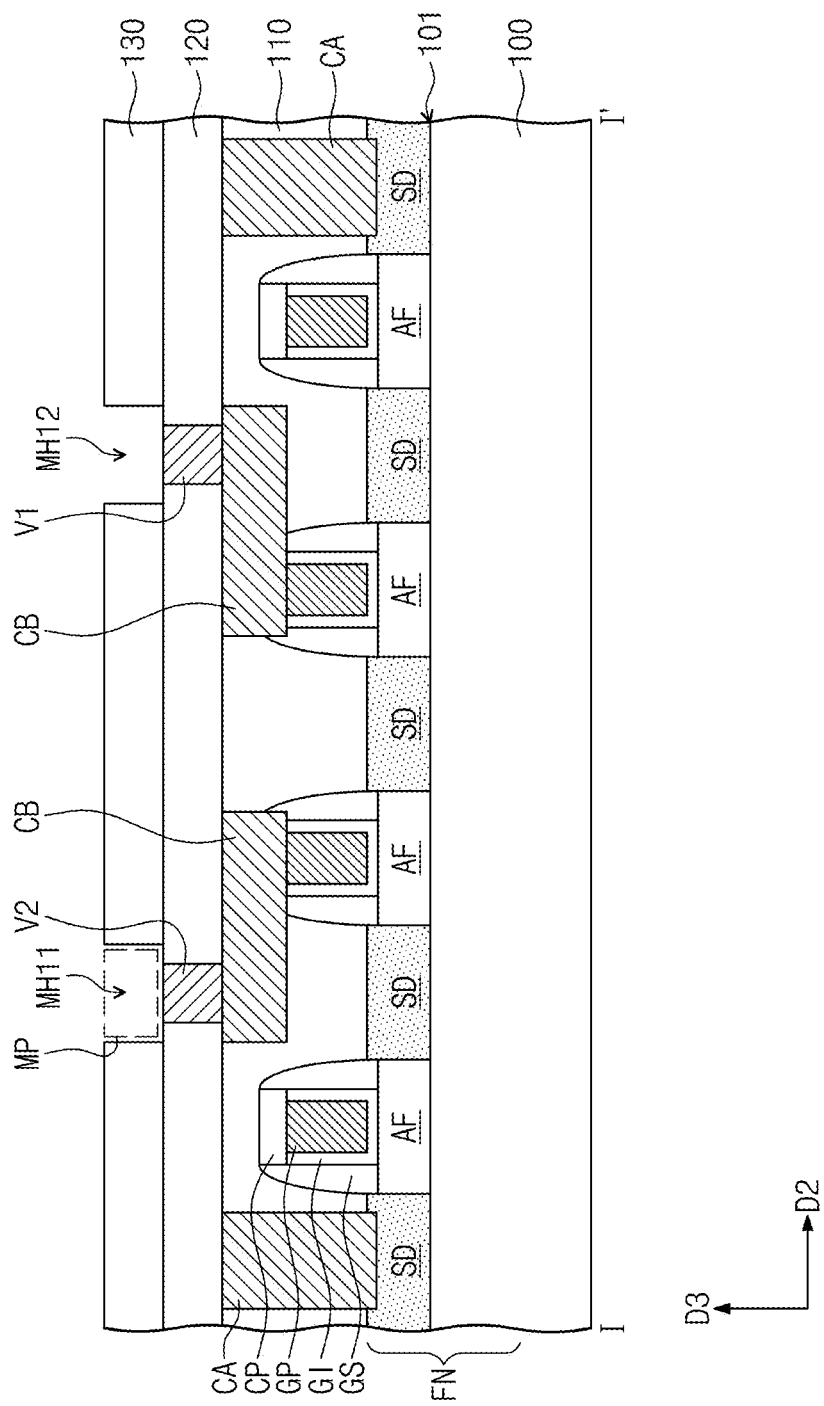
Figure 7B:
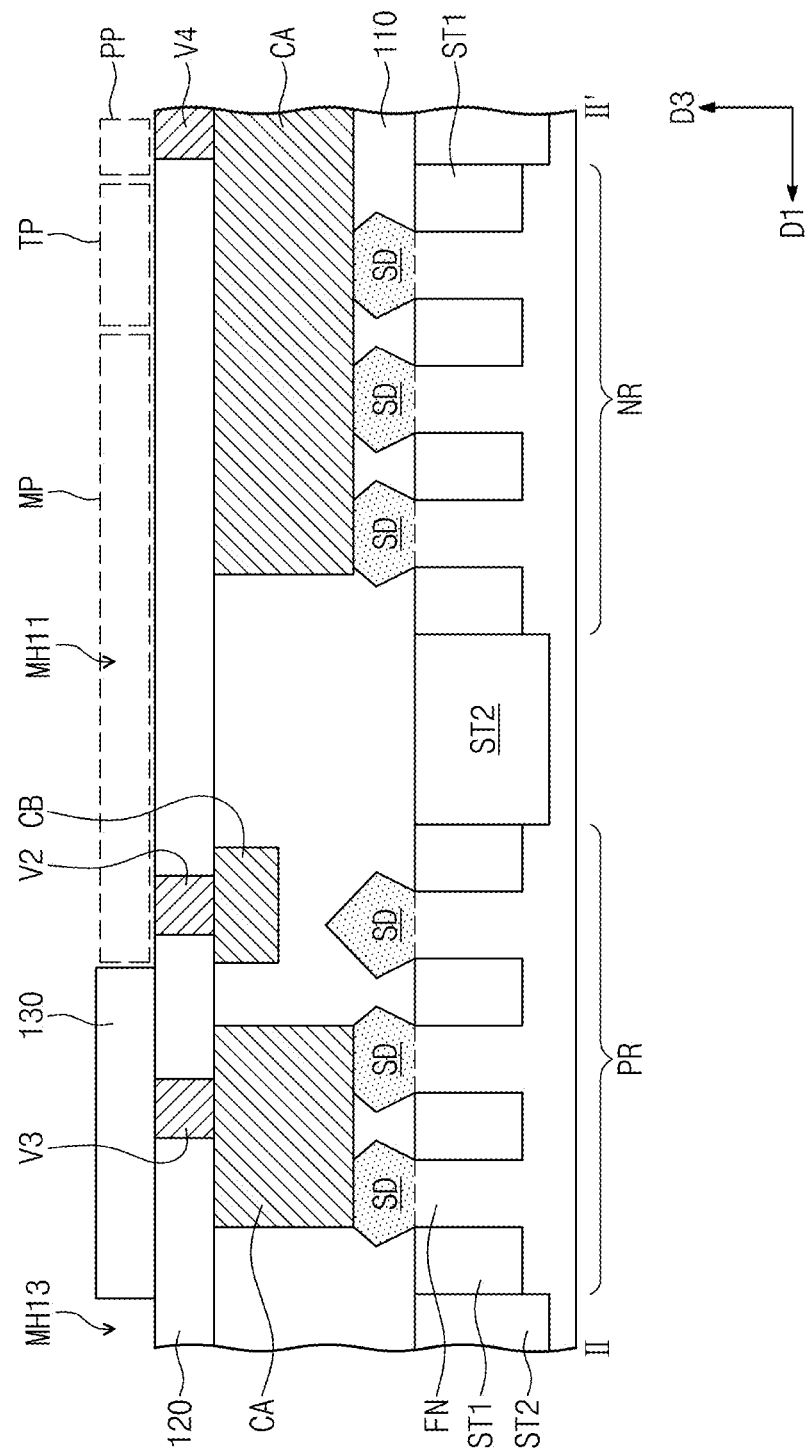
Figure 8:
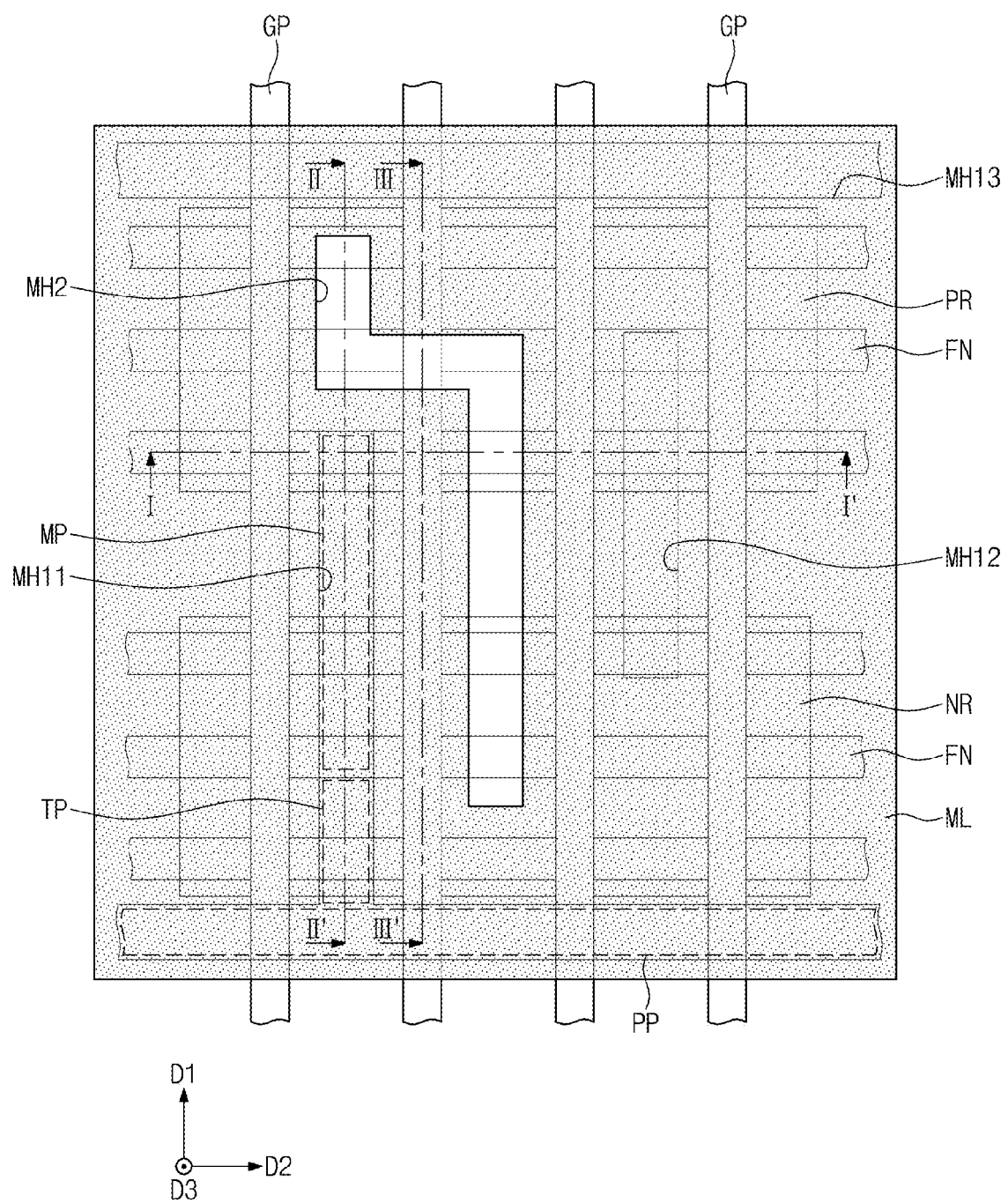
Figure 9A:
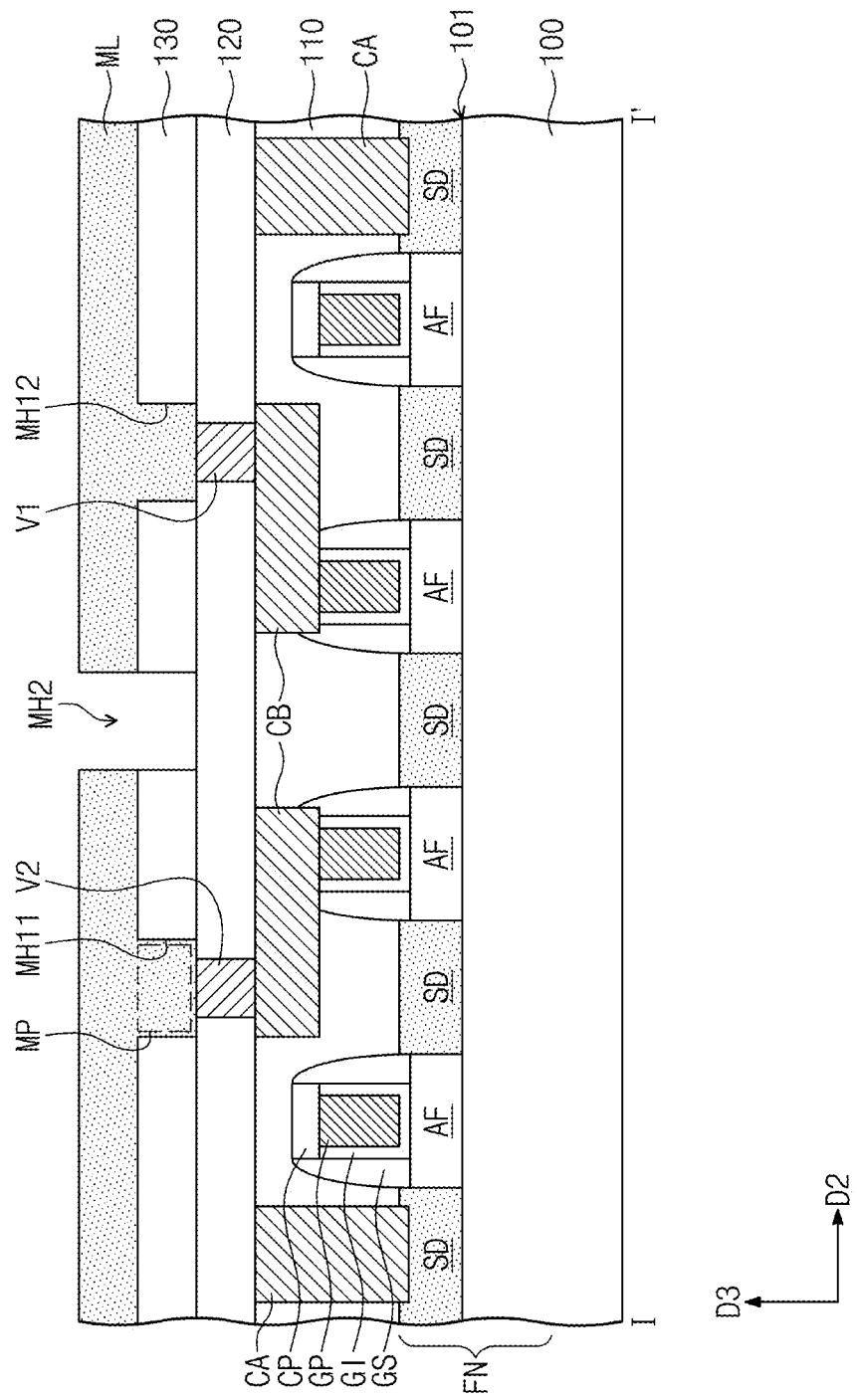
Figure 9B:
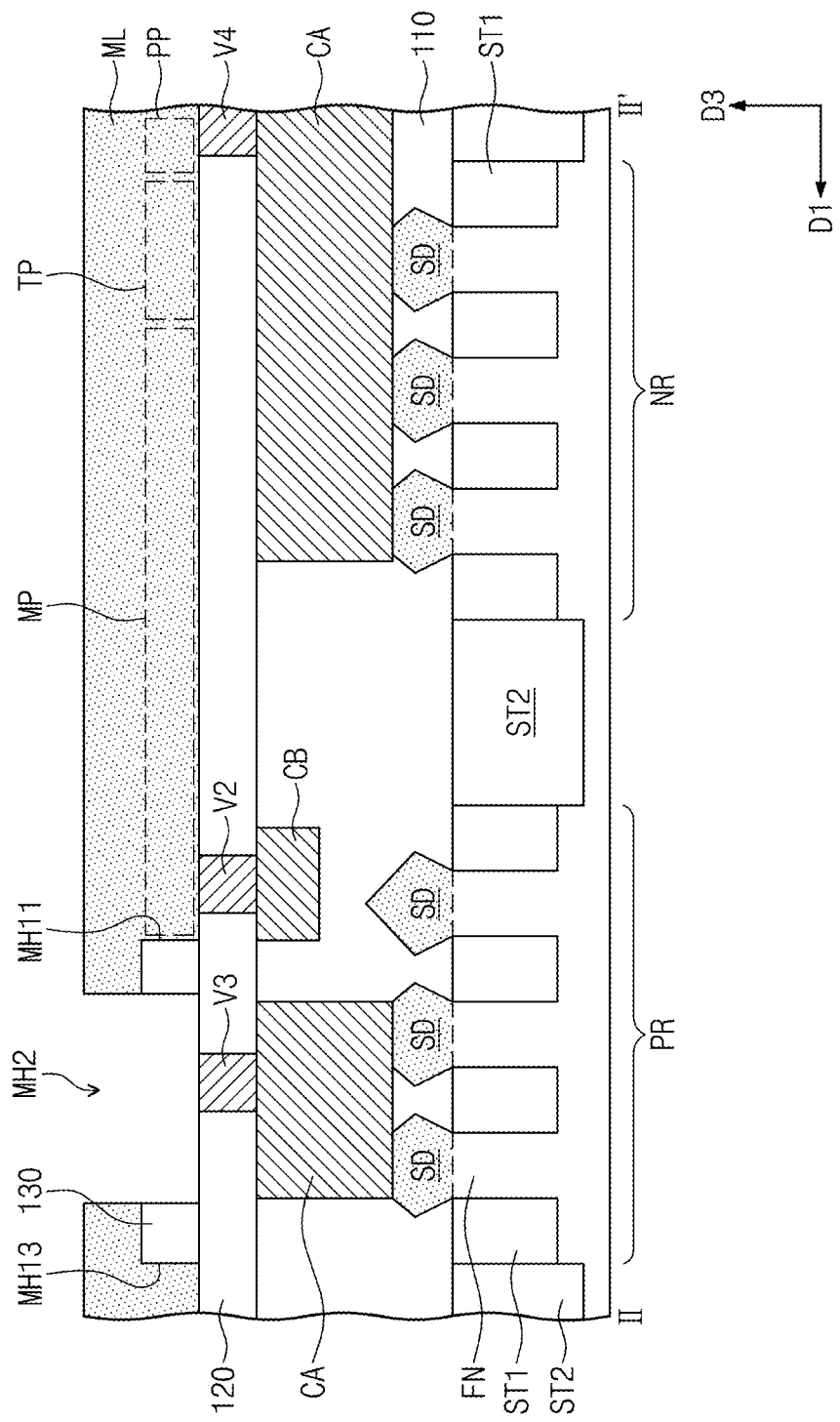
Figure 10:
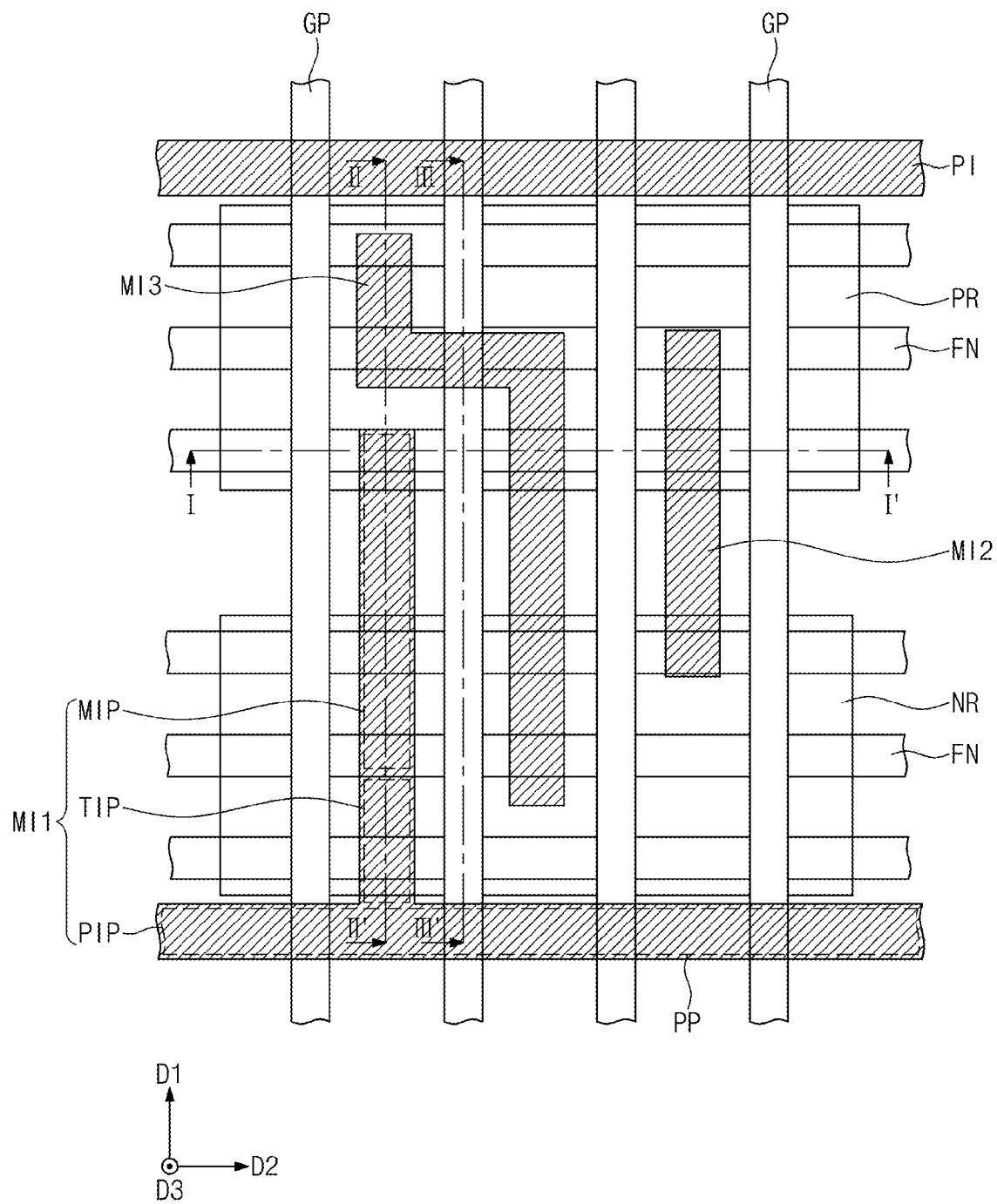
Figure 11A:
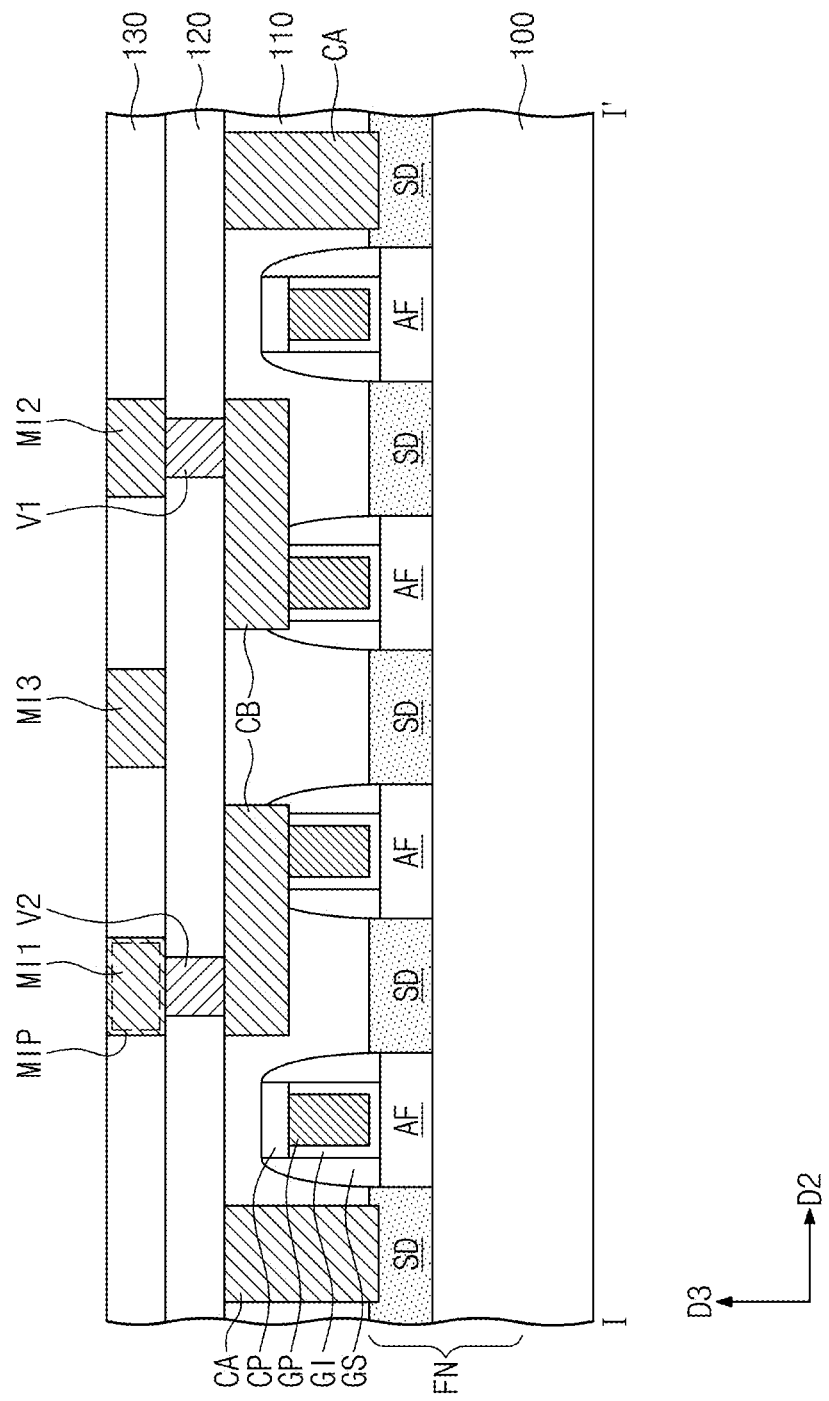
Figure 11B:
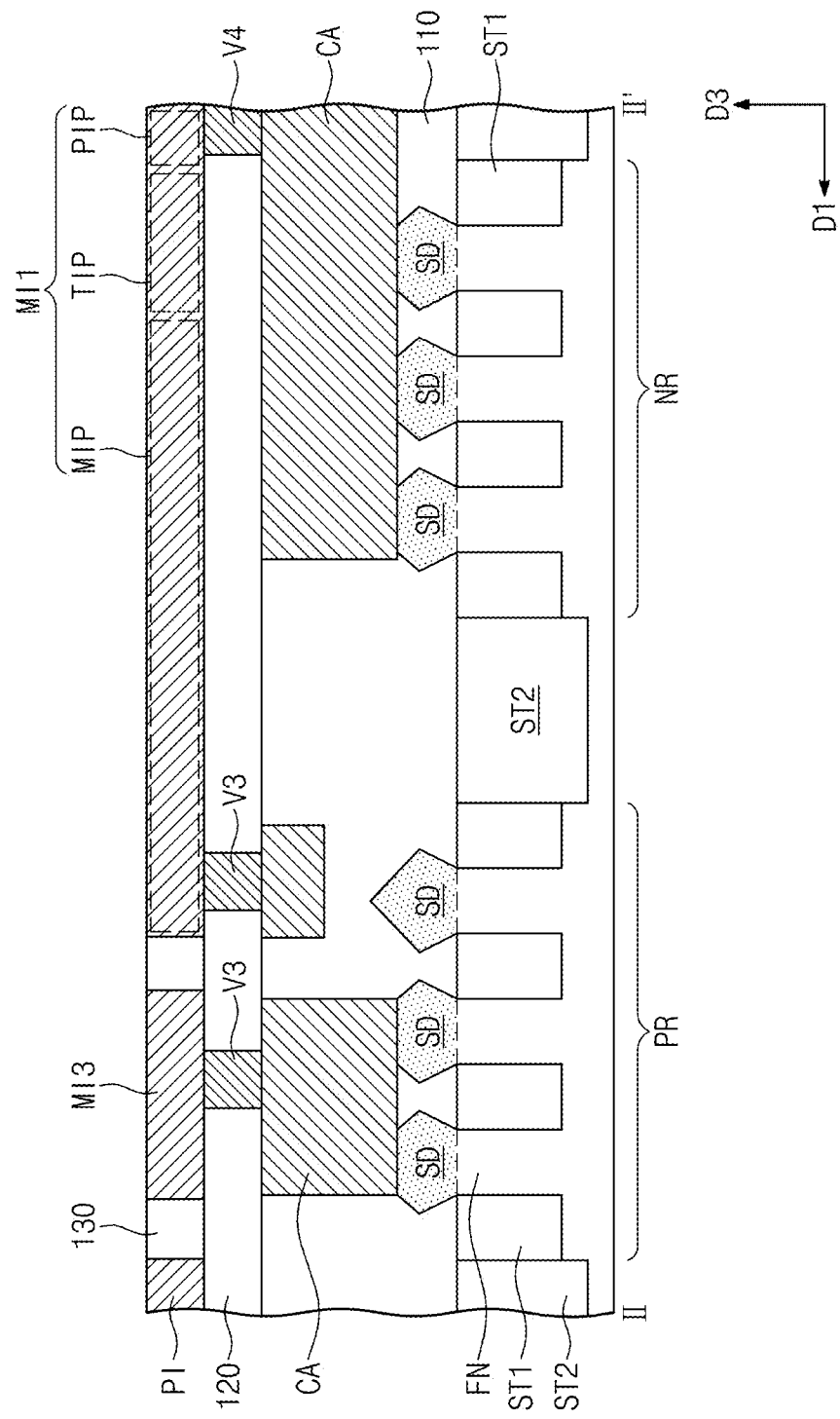
Figure 11C:
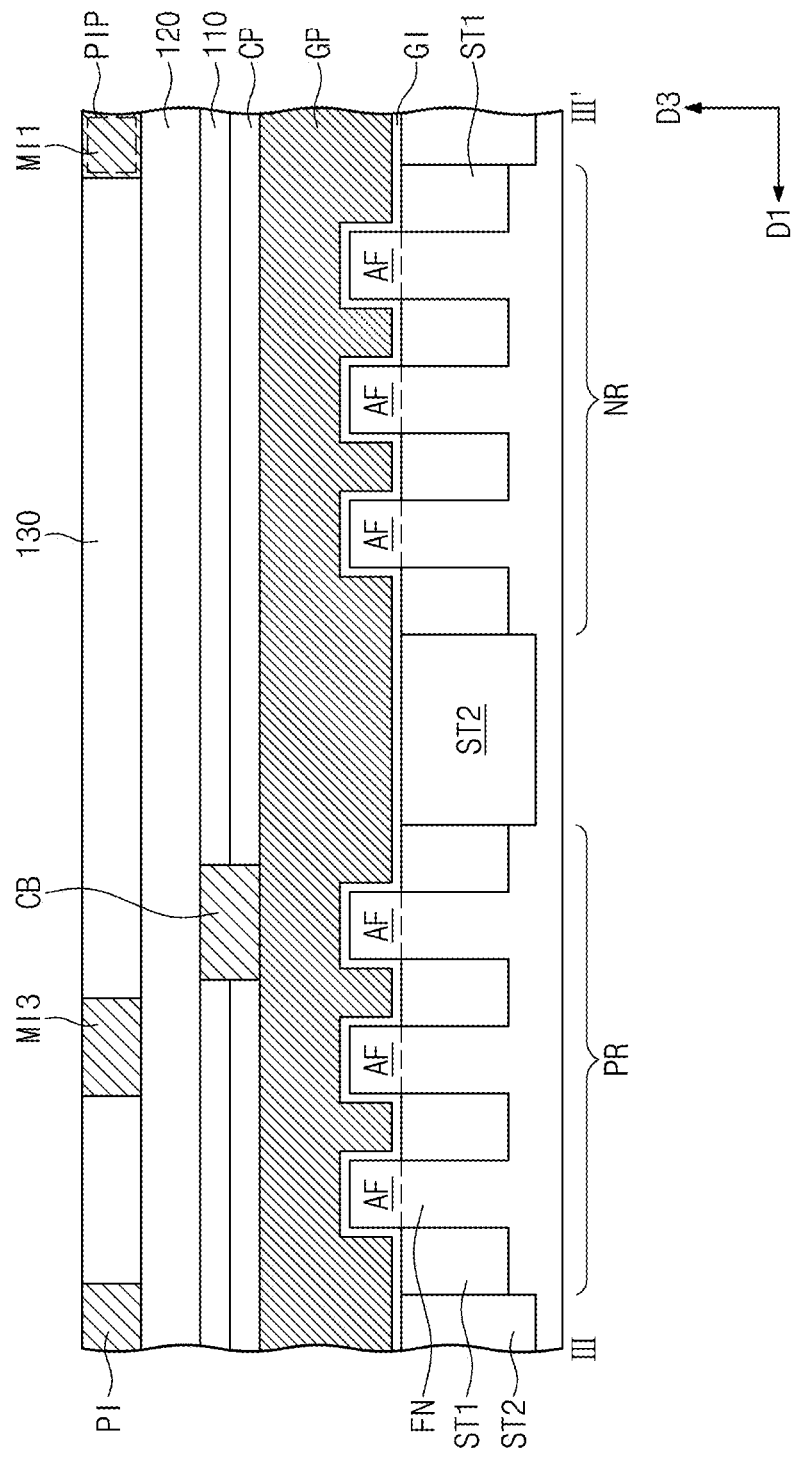

FIG. 3A and FIG. 3B are plan views provided to illustrate layout patterns and to describe a method of designing a layout for a first metal layer, according to some example embodiments of the inventive concepts. FIG. 3A and FIG. 3B illustrate steps of the tie-connection operation described with reference to FIG. 2 with reference to S121. The layout for the first metal layer refers to a layout for forming a first metal layer on a semiconductor substrate.

Referring to FIG. 3A, a layout for a standard cell may be prepared using a layout design tool. For example, layout patterns PR and NR may be provided to define active regions. The layout patterns PR and NR may include a PMOSFET region PR and an NMOSFET region NR. The PMOSFET and NMOSFET regions PR and NR may be spaced apart from each other in a specific direction.

Gate patterns GP may be provided to extend in the specific direction and to cross the PMOSFET and NMOSFET regions PR and NR. The gate patterns GP may be spaced apart from each other and extend parallel to each other.

In addition, although not shown, in the PMOSFET and NMOSFET regions PR and NR, layout patterns may be provided to define active patterns and source/drain regions, which will be formed on a semiconductor substrate. Furthermore, although not shown, layout patterns may be provided to define source/drain contacts and gate contacts, which will be connected to the first metal layer.

The preparation of the layout for the first metal layer of the standard cell may include selecting first and second power patterns PL1 and PL2, first and second metal patterns M11 and M12, and a third metal pattern M21. The first and second metal patterns M11 and M12 and the third metal pattern M21 may be provided between the first and second power patterns PL1 and PL2. Each of the first and second metal patterns M11 and M12 and the third metal pattern M21 may have a line-shaped structure extending in the direction. The first and second power patterns PL1 and PL2 may represent patterns, to which power and ground voltages (VDD and VSS) are respectively applied.

The first and second power patterns PL1 and PL2 and the first and second metal patterns M11 and M12 may constitute a first patterning group, and the third metal pattern M21 may constitute a second patterning group. In FIG. 3A, metal patterns that are differently shaded may represent metal patterns included in different patterning groups. The first and second patterning groups may be used to manufacture first and second photomasks, respectively. In other words, the first and second patterning groups may be respectively used for two different photolithography processes, each of which is performed to form a separate set of one or more metal lines on a semiconductor substrate. By forming the first metal layer using a plurality of photolithography processes, it is possible to overcome resolution limitation in a photolithography process and consequently to realize a reduction in space between metal lines. This will be described in more detail below.

Referring to FIG. 3B, a tie-connection pattern TC may be selected to connect the second power pattern PL2 to the first metal pattern M11 (for example, see the step S121 of FIG. 2). In the netlist, the first metal pattern M11 may be defined as an input pattern, to which an input signal is applied. In some example embodiments, the first metal pattern M11 may be connected to the second power pattern PL2. In some example embodiments, if and/or when the tie-connection pattern TC is provided, it may be possible to reduce a routing distance between the second power pattern PL2 and the first metal pattern M11. For example, the tie-connection pattern TC may include a geodesic connection of the second power pattern PL2 to the first metal pattern M11. As a result, the tie-connection pattern TC may allow the second power pattern PL2 to be connected to the first metal pattern M11 in a geodesic manner.

In some example embodiments, the tie-connection pattern TC may mitigate one or more technical issues. The tie-connection pattern TC may preclude connecting the second power pattern PL2 and the first metal pattern M11 to each other by vias and a metal pattern during the routing step described above. Such a metal pattern may be provided in a second metal layer and the vias may be between the first metal layer and the second metal layer. The preclusion of the vias and the metal pattern may lead to a decrease in length of a connection path between the second power pattern PL2 and the first metal pattern M11. Furthermore, the preclusion of the vias and the metal pattern may lead to an increase in operation speed of a semiconductor device. In addition, the preclusion of the metal pattern and the vias through the tie-connection pattern TC may result in a decrease of cell size and a decreased complexity of routing process.

In some example embodiments, where a plurality of photomasks are used to form the first metal layer, there may be limitations on the selected tie-connection pattern TC. For example, if and/or when the third metal pattern M21 is an input pattern configured to be connected to the second power pattern PL2, it may be difficult to locate the tie-connection pattern TC therebetween. This is because the third metal pattern M21 is included in a patterning group (e.g., the second patterning group) that is different from that of the second power pattern PL2. In the case where the tie-connection operation S121 is performed on patterns included in different patterning groups, there may be misalignment between the tie-connection pattern TC and the third metal pattern M21, after a photolithography process. However, in some example embodiments, the tie-connection operation is performed on patterns included in the same patterning group, an input pattern, a power pattern, and a tie pattern therebetween may be realized as a single metal line by using a single photomask. This will be described in more detail below.

FIG. 4, FIG. 6, FIG. 8, and FIG. 10 are plan views illustrating a process of manufacturing a semiconductor device (for example, using the afore-described layout) according to some example embodiments of the inventive concepts. FIG. 5A, FIG. 7A, FIG. 9A, and FIG. 11A are sectional views along line I-I' of FIG. 4, FIG. 6, FIG. 8, and FIG. 10, respectively, FIG. 5B, FIG. 7B, FIG. 9B, and FIG. 11B are sectional views along line II-II' of FIG. 4, FIG. 6, FIG. 8, and FIG. 10, respectively, and FIG. 5C, FIG. 7C, FIG. 9C, and FIG. 11C are sectional views along line III-III' of FIG. 4, FIG. 6, FIG. 8, and FIG. 10, respectively.

Referring to FIG. 4, FIG. 5A, FIG. 5B, and FIG. 5C, a substrate 100 may be provided. In some example embodiments, the substrate 100 may be at least one of a silicon substrate, a germanium substrate, and a silicon-on-insulator (SOI) substrate. Active patterns FN may be formed in an upper portion of the substrate 100. First device isolation layers ST1 may be formed to fill a gap region between the active patterns FN. Second device isolation layers ST2 may be formed on the substrate 100 to define the PMOSFET and NMOSFET regions PR and NR. The first and second device isolation layers ST1 and ST2 may be formed by a shallow trench isolation (STI) process and may include, for example, a silicon oxide layer.

In each of the first and second device isolation layers ST1 and ST2, a depth may refer to a length measured in a direction opposite to a third direction D3. The third direction D3 may be a direction that is normal to the top surface 101 of the substrate 100. As an example, the first device isolation layers ST1 may have a depth smaller than that of the second device isolation layers ST2. In this case, the first device isolation layers ST1 may be formed by a process different from that for the second device isolation layers ST2. As another example, the first device isolation layers ST1 may be formed at the same time as the second device isolation layers ST2, and in this case, the first device isolation layers ST1 may have substantially the same depth as the second device isolation layers ST2.

The gate patterns GP may be formed on the active pattern FN to cross the active pattern FN or extend in a first direction D1. The gate patterns GP may be spaced apart from each other in a second direction D2. A gate insulating pattern GI may be formed below each of the gate patterns GP, and gate spacers GS may be formed on both side surfaces of each of the gate patterns GP. In addition, a capping pattern CP may be formed to cover a top surface of each of the gate patterns GP. A first interlayered insulating layer 110 may be formed to cover the gate patterns GP.

The gate patterns GP may be formed of or include at least one of doped semiconductors, metals, or conductive metal nitrides. The gate insulating pattern GI may include at least one of a silicon oxide layer, a silicon oxynitride layer, or a high-k dielectric layer whose dielectric constant is higher than that of a silicon oxide layer. Each of the capping pattern CP and the gate spacers GS may include at least one of a silicon oxide layer, a silicon nitride layer, or a silicon oxynitride layer. The first interlayered insulating layer 110 may include at least one of a silicon oxide layer and a silicon oxynitride layer.

Source/drain regions SD may be provided in portions of the active patterns FN (e.g., at both sides of each of the gate patterns GP). The source/drain regions SD may be p- or n-type impurity regions.

The source/drain regions SD may be epitaxial patterns, which may be formed by a selective epitaxial growth process. The source/drain regions SD may include a semiconductor element different from those of the substrate 100. As an example, the source/drain regions SD may be formed of or include a semiconductor material having a lattice constant different from (for example, greater or smaller than) the substrate 100. Accordingly, the source/drain regions SD may exert a compressive stress or a tensile stress on the channel regions AF. As an example, in the case where the substrate 100 is a silicon wafer, the source/drain regions SD of the PMOSFET region PR may be formed of or include a silicon-germanium (e-SiGe) or germanium layer. In this case, the source/drain regions SD may exert a compressive stress on the channel regions AF. As another example, in the case where the substrate 100 is a silicon wafer, the source/drain regions SD of the NMOSFET region NR may be formed of or include silicon carbide (SiC). In this case, the source/drain regions SD may exert a tensile stress on the channel regions AF. The compressive or tensile stress exerting on the channel regions AF may make it possible to increase mobility of carriers in the channel regions AF, when the transistors are operated.

Source/drain contacts CA may be formed between the gate patterns GP. The source/drain contacts CA may be directly coupled to and electrically connected to the source/drain regions SD. The source/drain contacts CA may be provided in the first interlayered insulating layer 110. At least one of the source/drain contacts CA may be used to connect some of the source/drain regions SD arranged in the first direction D1.

Gate contacts CB may be formed on the first interlayered insulating layer 110. Each of the gate contacts CB may be directly connected to the gate pattern GP through the capping pattern CP. Bottom surfaces of the gate contacts CB may be positioned at a higher level than those of the source/drain contacts CA. Also, the bottom surfaces of the gate contacts CB may be positioned at a higher level than top surfaces of the source/drain regions SD.

Referring to FIG. 3A, FIG. 3B, FIG. 6, FIG. 7A, FIG. 7B, and FIG. 7C, a second interlayered insulating layer 120 and a third interlayered insulating layer 130 may be sequentially formed on the first interlayered insulating layer 110. For simplicity, some elements CA and CB previously described with reference to FIG. 4 may be omitted in FIG. 6, FIG. 8, and FIG. 10, although it will be understood that such elements may be included in the example embodiments illustrated in such Figures. First to fourth vias V1, V2, V3, and V4 may be formed in the second interlayered insulating layer 120. The first and second vias V1 and V2 may be electrically disconnected from the gate contacts CB and the third and fourth vias V3 and V4 may be electrically connected to the source/drain contacts CA.

A first photolithography process using a first photomask may be performed to form a first set of metal interconnection holes in the third interlayered insulating layer 130. The first set of metal interconnection holes includes, in the illustrated example embodiment, first to third metal interconnection holes MH11, MH12, and MH13 penetrating the third interlayered insulating layer 130. The first metal interconnection hole MH11 may include a power hole portion PP extending parallel to the second direction D2, an interconnection hole portion MP extending in the first direction D1, and a tie hole portion TP therebetween.

As described with reference to FIG. 3A and FIG. 3B, the first photomask may be manufactured using the first patterning group including the first and second power patterns PL1 and PL2, the first and second metal patterns M11 and M12, and the tie-connection pattern TC. Thus, the first set of metal interconnection holes may be formed according to the first patterning group.

For example, the formation of the first to third metal interconnection holes MH11, MH12, and MH13 may include forming first photoresist patterns on the third interlayered insulating layer 130 using a first photomask manufactured based on the first patterning group, and etching the third interlayered insulating layer 130 using the first photoresist patterns as an etch mask to form the first to third metal interconnection holes MH11, MH12, and MH13. As a result, the power hole portion PP, the interconnection hole portion MP, and the tie hole portion TP may be formed from the second power pattern PL2, the first metal pattern M11, and the tie-connection pattern TC, respectively, and they may be connected to form a single element (e.g., the first metal interconnection hole MH11). In addition, the second metal interconnection hole MH12 and the third metal interconnection hole MH13 may be originated from the second metal pattern M12 and the first power pattern PL1, respectively.

Referring to FIG. 3A, FIG. 3B, FIG. 8, FIG. 9A, FIG. 9B, and FIG. 9C, a mask layer ML may be formed to fill the first to third metal interconnection holes MH11, MH12, and MH13. A second photolithography process using a second photomask may be performed to form a second set of metal interconnection holes in the third interlayered insulating layer 130. The second set of metal interconnection holes, in the illustrated example embodiment, includes fourth metal interconnection hole MH2 penetrating the mask layer ML and the third interlayered insulating layer 130.

As previously described with reference to FIG. 3A and FIG. 3B, the second photomask may be manufactured using the second patterning group including the third metal pattern M21. The formation of the fourth metal interconnection hole MH2 may include forming a second photoresist pattern on the mask layer ML using the second photomask, which is manufactured based on the second patterning group, and etching the mask layer ML and the third interlayered insulating layer 130 using the second photoresist pattern as an etch mask to form the fourth metal interconnection hole MH2. Thus, the second set of metal interconnection holes may be formed according to the second patterning group. In other words, the fourth metal interconnection hole MH2 may be originated from the third metal pattern M21.

Referring to FIG. 3A, FIG. 3B, FIG. 10, FIG. 11A, FIG. 11B, and FIG. 11C, the mask layer ML may be removed. Thereafter, metal lines may be formed by filling the first and second sets of metal interconnection holes with at least one conductive material. For example, first and second metal lines MI1 and MI2 may be formed by filling the first and second metal interconnection holes MH11 and MH12 with a conductive material. A power interconnection PI may be formed by filling the third metal interconnection hole MH13 with a conductive material. A third metal line MI3 may be formed by filling the fourth metal interconnection hole MH2 with a conductive material. The first metal line MI1 may include a power interconnection portion PIP, a metal interconnection portion MIP, and a tie interconnection portion TIP that are connected to each other to form a single pattern. In some example embodiments the power interconnection portion PIP, the metal interconnection portion MIP, and the tie interconnection portion TIP may be originated from the second power pattern PL2, the first metal pattern M11, and the tie-connection pattern TC, respectively.

The power interconnection PI may be an interconnection line, to which the power voltage (VDD) is applied. The power interconnection portion PIP may be a part of an interconnection line to which the ground voltage (VSS) is applied. One of the gate patterns GP may be connected to the second metal line MI2 through the gate contact CB and the first via V1. Another one of the gate patterns GP may be connected to the first metal line MI1 through the gate contact CB and the second via V1. In some example embodiments, the ground voltage (VSS) applied through the power interconnection portion PIP may be input to the other one of the gate patterns GP through the tie interconnection portion TIP and the metal interconnection portion MIP.

In some example embodiments, the second metal line MI2 may serve as another input pattern of the standard cell and may be used to receive an input signal from a standard cell adjacent thereto. One of the source/drain contacts CA may be connected to the power interconnection portion PIP through the fourth via V4. Accordingly, the ground voltage (VSS) may be applied to the source/drain region SD connected to the one of the source/drain contacts CA.

In a method of manufacturing a semiconductor device according to some example embodiments of the inventive concepts, the first metal layer may be formed using a plurality of photomasks, which are respectively manufactured based on a plurality of patterning groups, as described above. Separate sets of metal interconnection holes may be formed according to separate photomasks. Separate photomasks may be manufactured according to separate, respective patterning groups of a layout pattern. Thus, separate sets of metal interconnection holes may be formed according to separate patterning groups. Furthermore, since the tie-connection pattern TC is realized in the same photomask as that for the second power pattern PL2 and the first metal pattern M11, layout patterns for them may be realized as a single pattern (e.g., the first metal line MI1). Accordingly, it may be possible to effectively apply input signals (e.g., the power or ground voltages (VDD or VSS)) to the standard cell.

Figure 12:
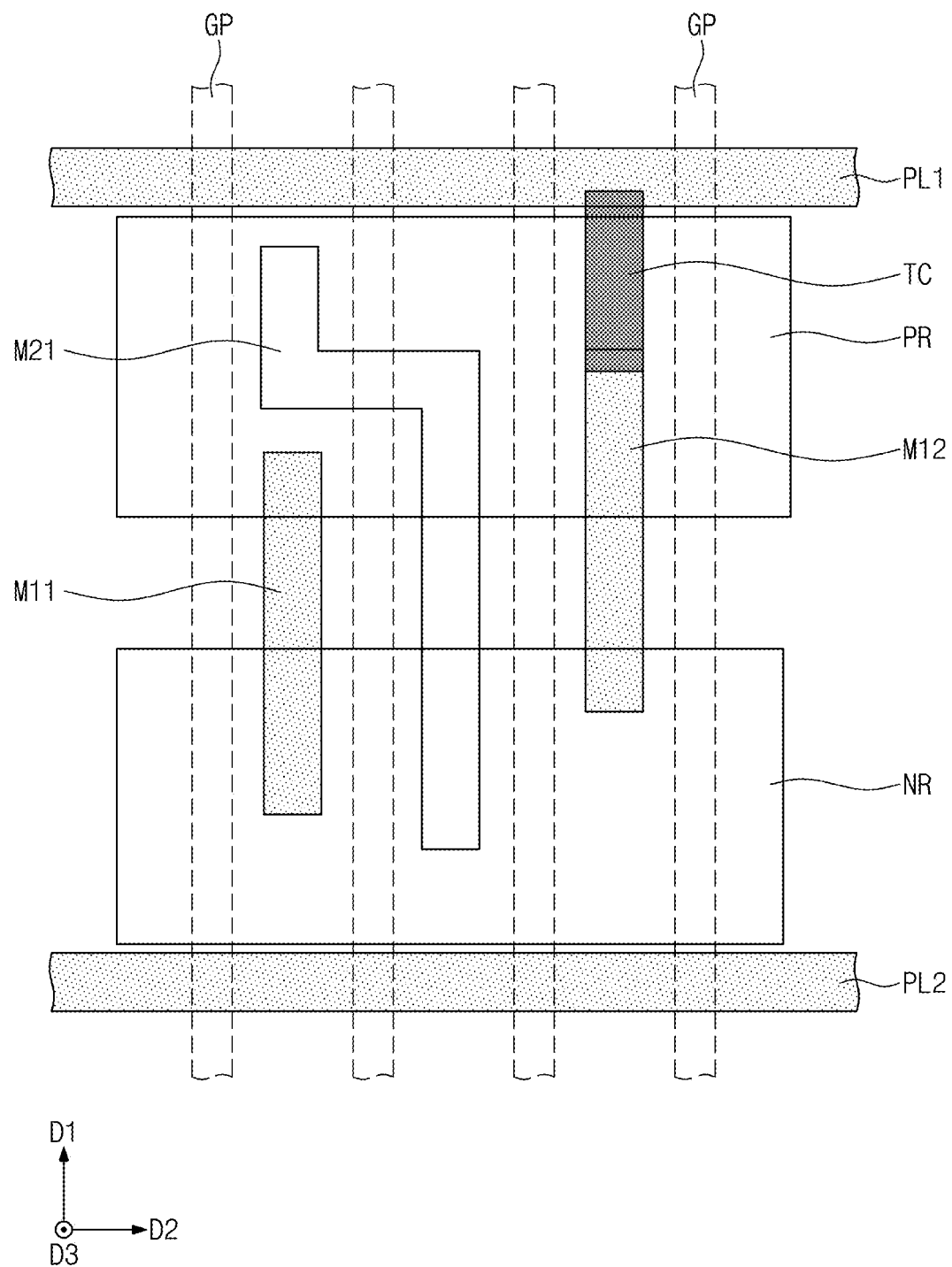
FIG. 12 is a plan view provided to illustrate a layout pattern and to describe a method of designing a layout for a first metal layer, according to some example embodiments of the inventive concepts.
Figure 13:
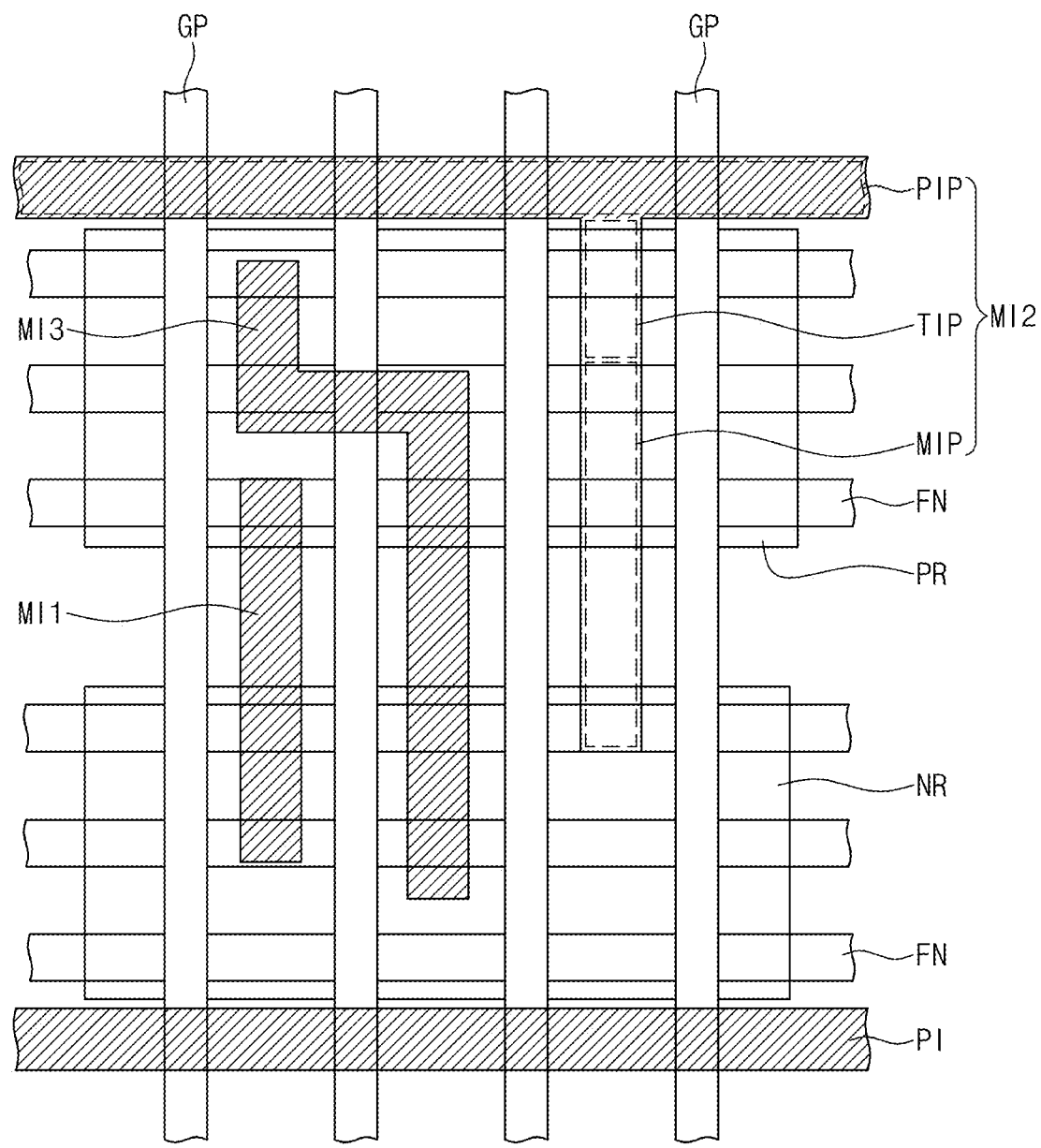
FIG. 13 is a plan view illustrating a semiconductor device according to some example embodiments of the inventive concepts.

FIG. 12 is a plan view provided to illustrate a layout pattern and to describe a method of designing a layout for a first metal layer, according to some example embodiments of the inventive concepts. FIG. 13 is a plan view illustrating a semiconductor device according to some example embodiments of the inventive concepts.

Referring to FIG. 12 and FIG. 13, unlike the example embodiment illustrated in FIG. 3B, a tie-connection pattern TC that connects the first power pattern PL1 to the second metal pattern M12 may be selected. In the netlist according to some example embodiments of the inventive concepts, the second metal pattern M12 may be defined as an input pattern, to which an input signal is applied. In this case, the second metal pattern M12 may be connected to the first power pattern PL1. In some example embodiments, if and/or when the tie-connection pattern TC is provided, it may be possible to reduce a routing distance between the first power pattern PL1 and the second metal pattern M12.

First to third metal lines MI1, MI2, and MI3 constituting a semiconductor device may be formed using the layout pattern for the first metal layer. The semiconductor device and the first to third metal lines MI1, MI2, and MI3 may be formed by a method similar to that previously described with reference to FIG. 4, FIG. 5A, FIG. 5B, FIG. 5C, FIG. 6, FIG. 7A, FIG. 7B, FIG. 7C, FIG. 8, FIG. 9A, FIG. 9B, FIG. 9C, FIG. 10, FIG. 11A, FIG. 11B, and FIG. 11C.

The second metal line MI2 may include the power interconnection portion PIP, the metal interconnection portion MIP, and the tie interconnection portion TIP. In some example embodiments, the power interconnection portion PIP, the metal interconnection portion MIP, and the tie interconnection portion TIP may be originated from the first power pattern PL1, the second metal pattern M12, and the tie-connection pattern TC, respectively.

Figure 14:
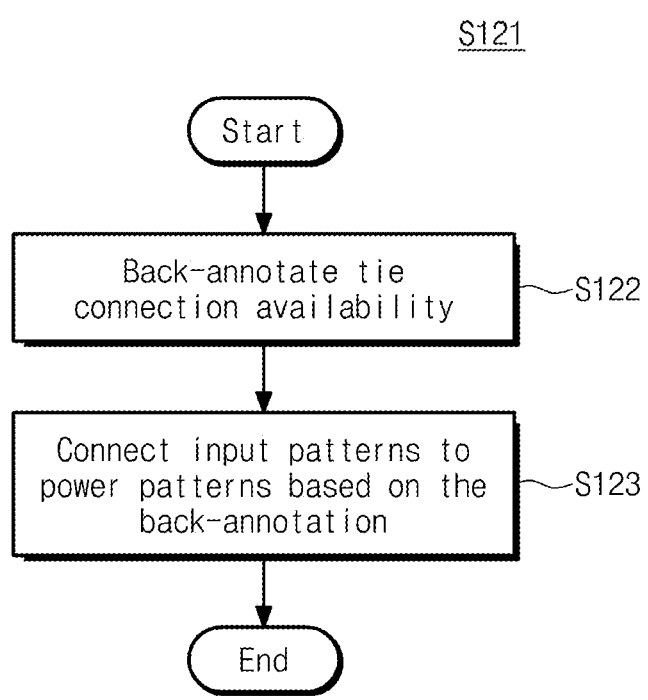
FIG. 14 is a flow chart illustrating a method of designing a layout, according to some example embodiments of the inventive concepts.
Figure 15:
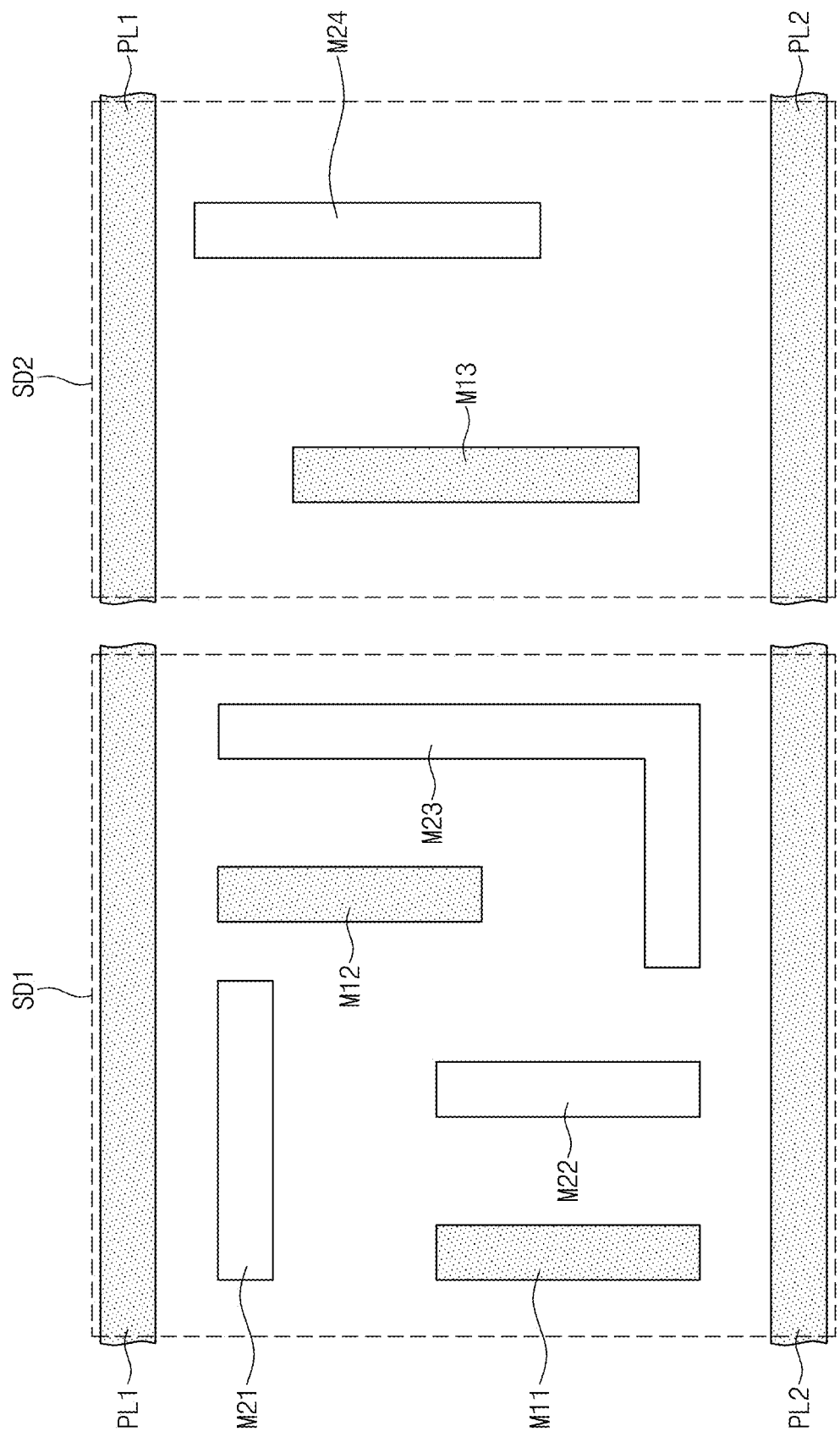
FIG. 15 is a plan view illustrating layout patterns for a first metal layer of standard cells, according to some example embodiments of the inventive concepts.

FIG. 14 is a flow chart illustrating a method of designing a layout, according to some example embodiments of the inventive concepts. For example, FIG. 14 shows a method of automatically performing the tie-connection operation S121 described with reference to FIG. 2 and FIG. 3B. The method of automatically performing the tie-connection operation S121 may be performed by the computer system 1 illustrated and described with reference to FIG. 1. FIG. 15 is a plan view illustrating layout patterns for a first metal layer of standard cells, according to some example embodiments of the inventive concepts. FIG. 16A, FIG. 16B, FIG. 17A, and FIG. 17B are plan views illustrating a back-annotation operation on the layout of FIG. 15, according to some example embodiments of the inventive concepts. For concise description, an element previously described with reference to FIG. 3A and FIG. 3B may be identified by a similar or identical reference number without repeating an overlapping description thereof.

Referring to FIG. 14, at S122 the computer system 1 may prepare back-annotation information on tie-connection availability for each of the standard cells contained in a cell library. The back-annotation information may be prepared to contain information on whether each of input patterns in the standard cell is allowed to be connected to a pair of power patterns using a tie-connection operation. The back-annotation information may be used to perform an automated tie-connection operation, which will be described in more detail below.

As an example, first and second standard cells SD1 and SD2 may be provided in the cell library, as shown in FIG. 15. A layout for the first metal layer of the first standard cell SD1 may include first and second power patterns PL1 and PL2, first and second metal patterns M11 and M12, and fourth to sixth metal patterns M21, M22, and M23. A layout for the first metal layer of the second standard cell SD2 may include the first and second power patterns PL1 and PL2, a third metal pattern M13, and a seventh metal pattern M24. The first and second power patterns PL1 and PL2 and the first to third metal patterns M11, M12, and M13 may constitute a first patterning group, and the fourth to seventh metal patterns M21, M22, M23, and M24 may constitute a second patterning group.

In some example embodiments, the first to third metal patterns M11, M12, and M13 and the fifth to seventh metal patterns M22, M23, and M24 may be used as input patterns to be applied with input signals.

Figure 16B:
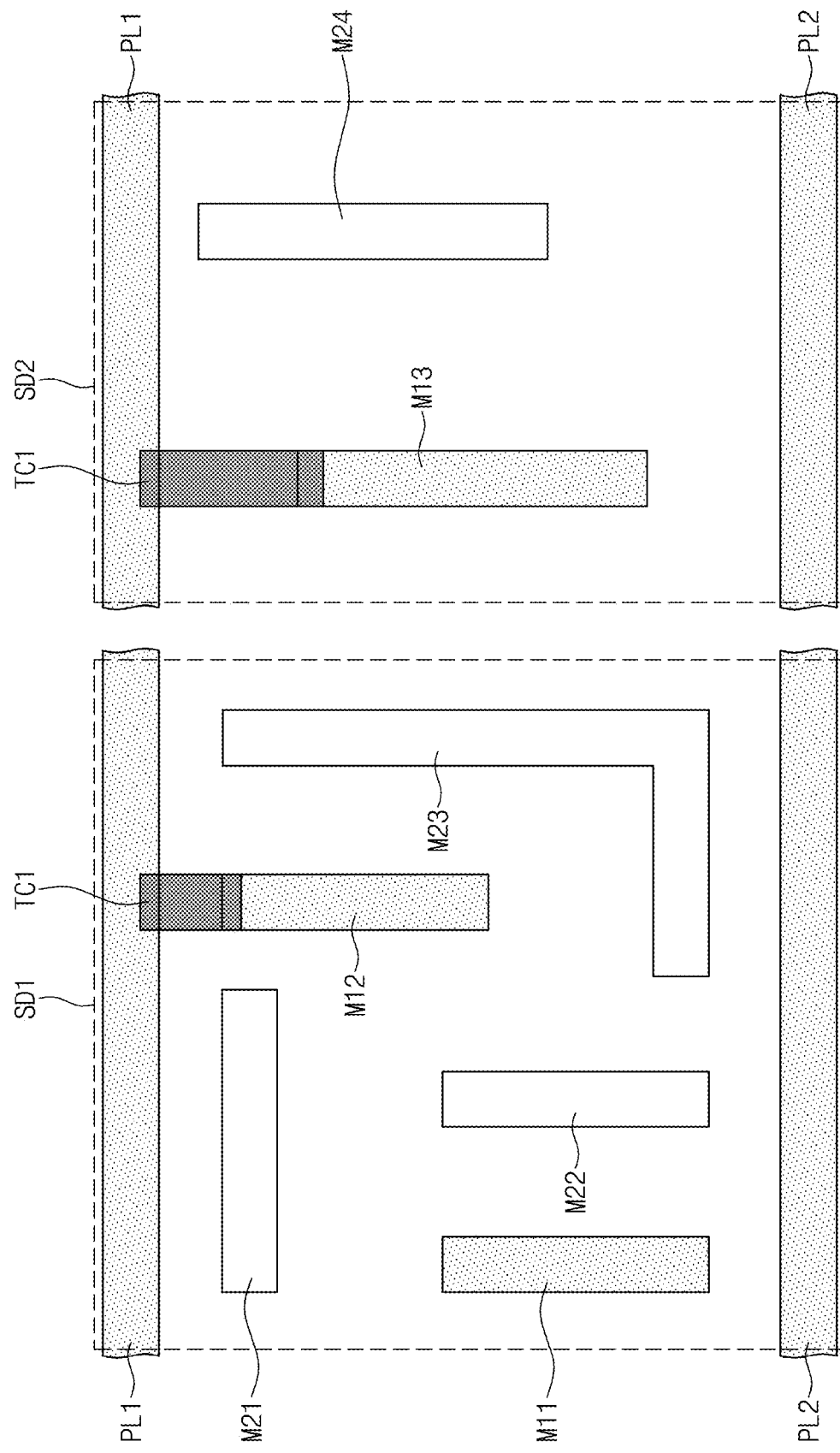

Referring to FIG. 16A and FIG. 16B, back-annotation information on the tie-connection availability for the first power pattern PL1 may be prepared. As shown in FIG. 16A, first preliminary tie-connection patterns TCa1 may be identified as being between the input patterns M11, M12, M13, M22, M23, and M24 and the first power pattern PL1. The first preliminary tie-connection patterns TCa1 may be selected to reduce a routing length from the input patterns M11, M12, M13, M22, M23, and M24 to the first power pattern PL1.

Referring to FIG. 16B, a design rule check may be performed on the first preliminary tie-connection patterns TCa1. In some example embodiments, the design rule check may be performed on the first preliminary tie-connection pattern TCa1, based on first to third design rules. In some example embodiments, the first design rule may be prepared to examine whether the input pattern and the first power pattern PL1, which are connected by the first preliminary tie-connection pattern TCa1, are included in the same patterning group, the second design rule may be prepared to examine whether the first preliminary tie-connection pattern TCa1 crosses other metal pattern, and the third design rule may be prepared to examine whether a distance from the first preliminary tie-connection pattern TCa1 to other metal pattern adjacent thereto is greater than a minimum distance that was given based on process properties of the photolithography process. The design rule check may make it possible to exclude the first preliminary tie-connection pattern TCa1 from the back-annotation information based on a determination that the first preliminary tie-connection pattern TCa1 violates the first to third design rules.

In the case where the input and power patterns are included in different patterning groups, different photomasks may be used in order to form the corresponding patterns in a semiconductor device. However, the use of the different photomasks may lead to misalignment between the tie-connection pattern and the input pattern. The design rule check based on the first design rule may make it possible to prevent such misalignment between the tie-connection pattern and the input pattern.

As an example, the sixth and seventh metal patterns M23 and M24, which are connected to the first power pattern PL1 through the first preliminary tie-connection patterns TCa1, may be included in a different patterning group (e.g., the second patterning group) from the first power pattern PL1. In this case, violation on the first design rule may be found by the design rule check. As a result, the first preliminary tie-connection patterns TCa1 between the first power pattern PL1 and the sixth and seventh metal patterns M23 and M24 may be excluded from the back-annotation information.

In addition, the first preliminary tie-connection pattern TCa1 on the first metal pattern M11 and the first preliminary tie-connection pattern TCa1 on the fifth metal pattern M22 may be extended to the first power pattern PL1 and may cross the fourth metal pattern M21. In this case that there is violation of the second design rule, the first preliminary tie-connection pattern TCa1 on the first metal pattern M11 and the first preliminary tie-connection pattern TCa1 on the fifth metal pattern M22 may be excluded from the back-annotation information.

By contrast, the first preliminary tie-connection pattern TCa1 on the second metal pattern M12 and the first preliminary tie-connection pattern TCa1 on the third metal pattern M13 may be selected without violation of the first, second, and third design rules, and thus, they may remain as first tie-connection patterns TC1 having the tie-connection availability. The back-annotation information on the tie-connection availability for the first power pattern PL1 may be prepared, based on these results, such that at least one of the first tie-connection patterns TC1 may be selected as a tie-connection pattern in a layout pattern according to the back-annotation information. For example, the second metal pattern M12 may be annotated with a mark (e.g., M12 (PL1)), and the third metal pattern M13 may be annotated with another mark (e.g., M13 (PL1)).

Figure 17A:
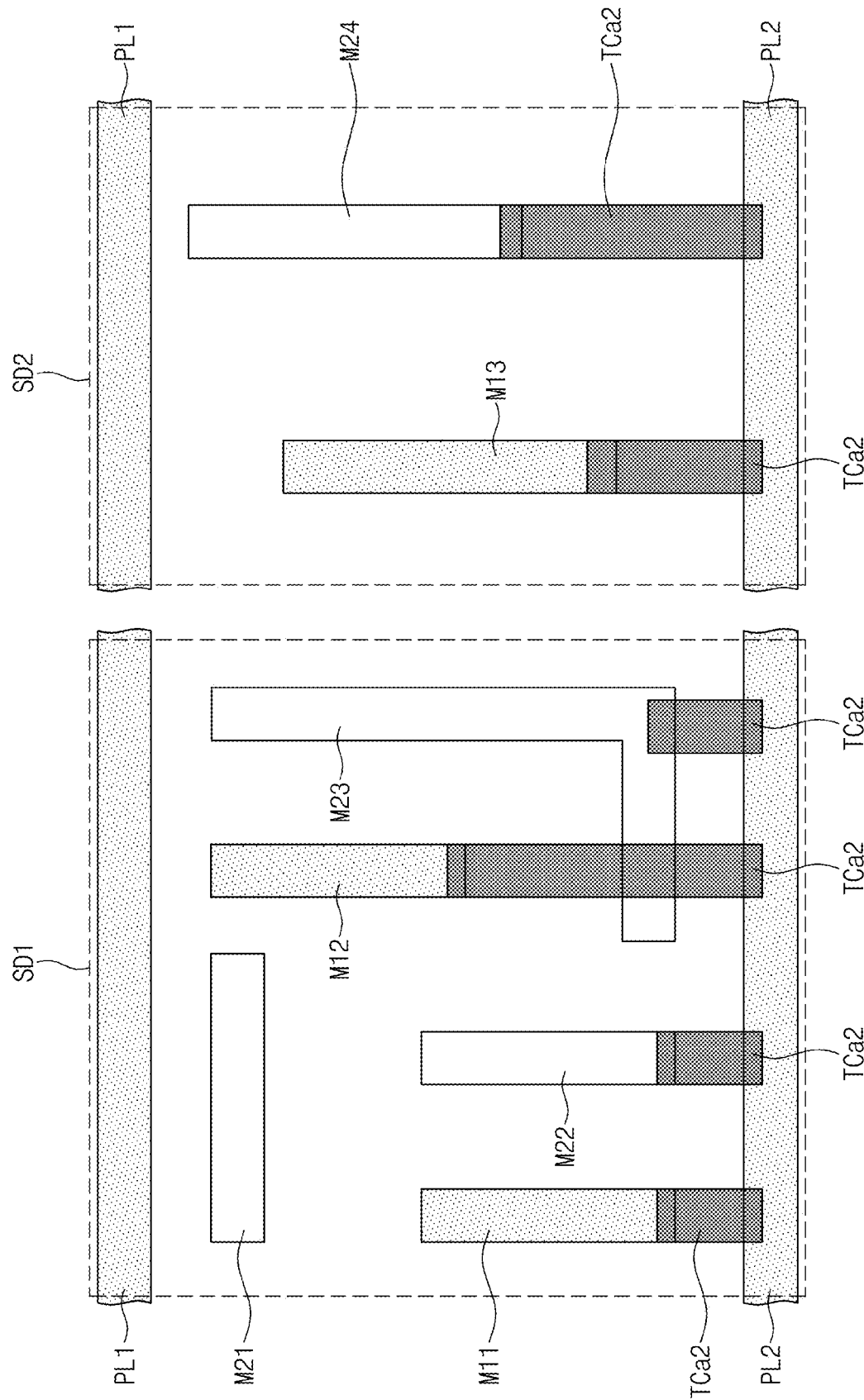
Figure 17B:
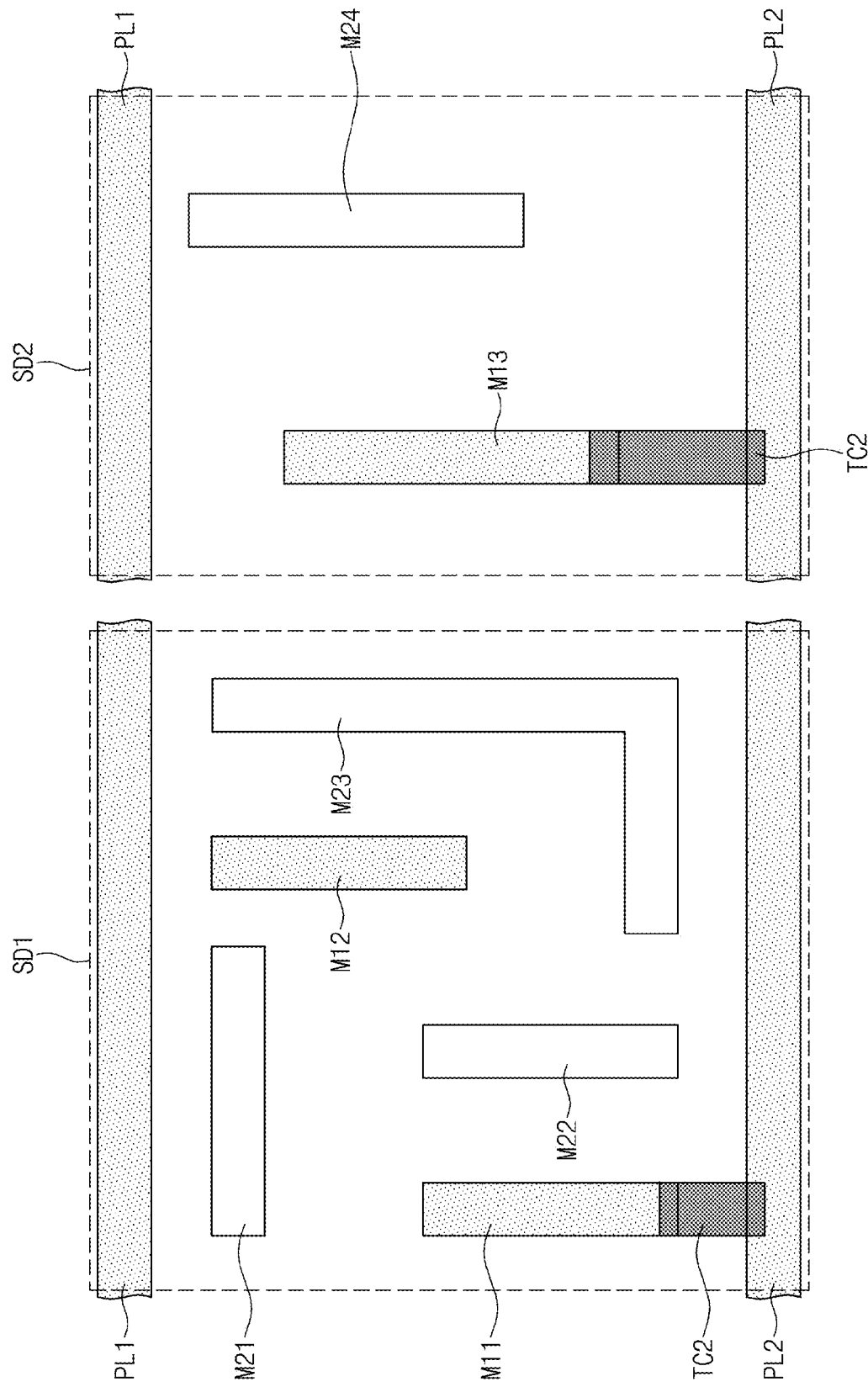

Referring to FIG. 17A and FIG. 17B, back-annotation information on tie-connection availability for the second power pattern PL2 may be prepared. Referring back to FIG. 17A, second preliminary tie-connection patterns TCa2 may be between the input patterns M11, M12, M13, M22, M23, and M24 and the second power pattern PL2. The second preliminary tie-connection patterns TCa2 may be selected to reduce a routing length from the input patterns M11, M12, M13, M22, M23, and M24 to the second power pattern PL2.

Referring to FIG. 17B, a design rule check may be performed on the second preliminary tie-connection patterns TCa2. For example, the design rule check may be performed in the same manner as that described with reference to FIG. 16B. As a result of the design rule check, it is possible to exclude the second preliminary tie-connection pattern TCa2 from the back-annotation information for violating the design rule.

As an example, since the fifth to seventh metal patterns M22, M23, and M24 are included in a patterning group (e.g., the second patterning group) that is different from that of the second power pattern PL2, the second preliminary tie-connection patterns TCa2 on them may be excluded from the back-annotation information.

In addition, the second preliminary tie-connection pattern TCa2 on the second metal pattern M12 may be extended to the second power pattern PL2 and may cross the sixth metal pattern M23. In this case that there is violation of the design rule, such second preliminary tie-connection pattern may be excluded from the back-annotation information.

By contrast, the second preliminary tie-connection pattern TCa2 on the first metal pattern M11 and the first preliminary tie-connection pattern TCa1 on the third metal pattern M13 may be selected without violation of the design rule, and thus, they may remain as second tie-connection patterns TC2 having the tie-connection availability. The back-annotation information on the tie-connection availability for the second power pattern PL2 may be prepared, based on these results, such that at least one of the second tie-connection patterns TC2 may be selected as a tie-connection pattern in a layout pattern according to the back-annotation information. For example, the first metal pattern M11 may be annotated with a mark (e.g., M11 (PL2)), and the third metal pattern M13 may be annotated with another mark (e.g., M13 (PL2)). As a result of the back-annotation operation described with reference to FIG. 16B, the marks may be given as follows:

M11 (PL2) M12 (PL1) M13 (PL1, PL2).

Referring back to FIG. 14, the input patterns of the standard cells may be automatically connected to the power patterns, based on the back-annotation information (in S123). This connection between the input and power patterns may include selecting the tie-connection patterns between the input and power patterns in an automated manner (e.g., using a method similar to that described with reference to FIGS. 3A and 3B).

Figure 18:
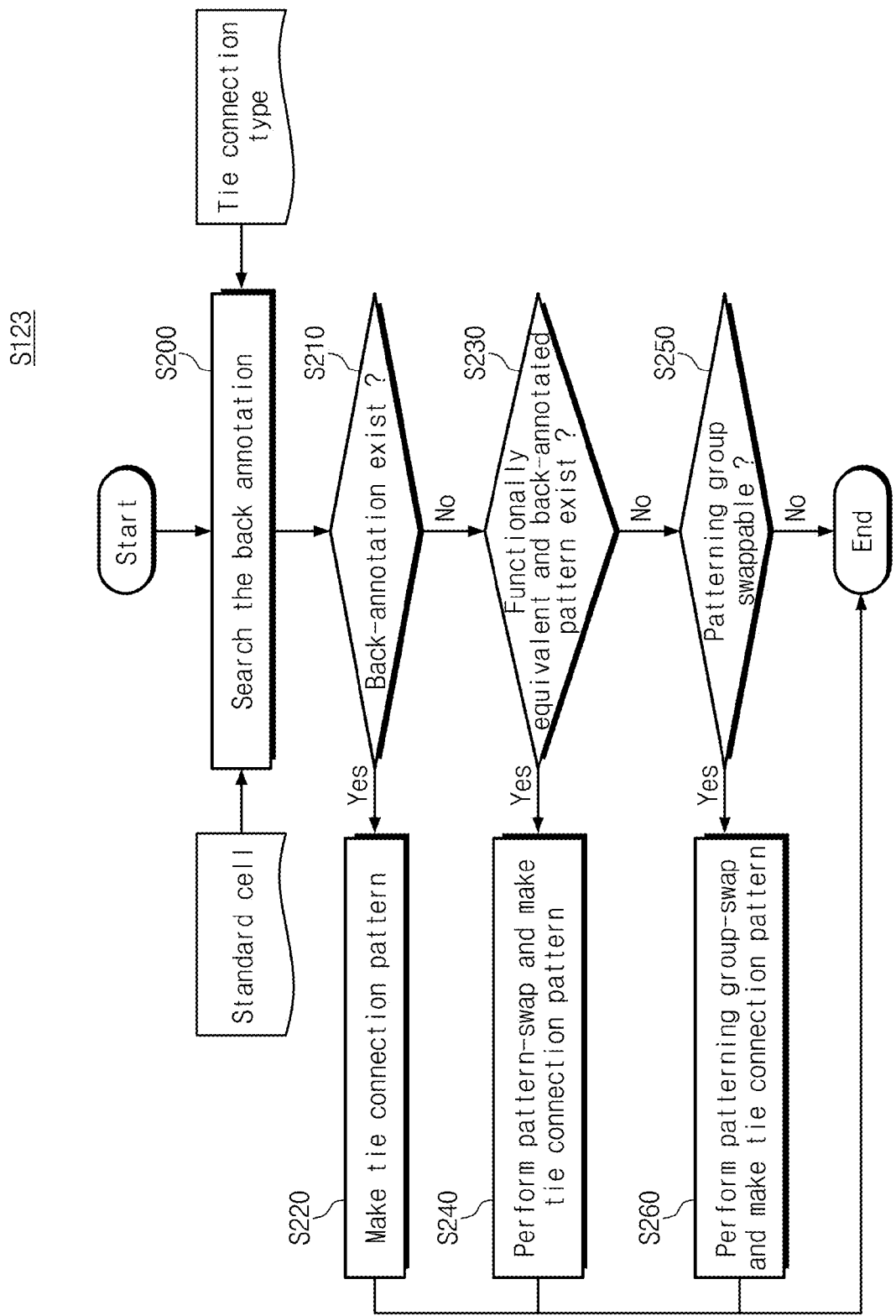
FIG. 18 is a flow chart illustrating an automated tie-connection operation, according to some example embodiments of the inventive concepts.

FIG. 18 is a flow chart illustrating an automated tie-connection operation, according to some example embodiments of the inventive concepts. The automated tie-connection operation S123 may be performed by the computer system 1 illustrated and described with reference to FIG. 1. FIG. 19A, FIG. 19B, FIG. 20A, FIG. 20B, FIG. 21A, and FIG. 21B are plan views, which are provided to describe a process of connecting an input pattern to a power pattern using the tie-connection operation illustrated in FIG. 18, and each of which illustrates layout patterns for a first metal layer.

Referring to FIG. 18, at S200, the computer system 1 may load a standard cell from the cell library and obtain information on an input pattern (e.g., a pattern to be connected to the power pattern) from the netlist. At S210, the computer system 1 may use the prepared back-annotation information (e.g., by the operation described with reference to FIG. 14) to examine tie-connection availability between the input pattern and the power pattern. At S220, if and/or when the examined tie-connection availability is higher than a specific level (e.g., given by the design rule), the computer system 1 may select a tie-connection pattern that is located therebetween.

Figure 19A:
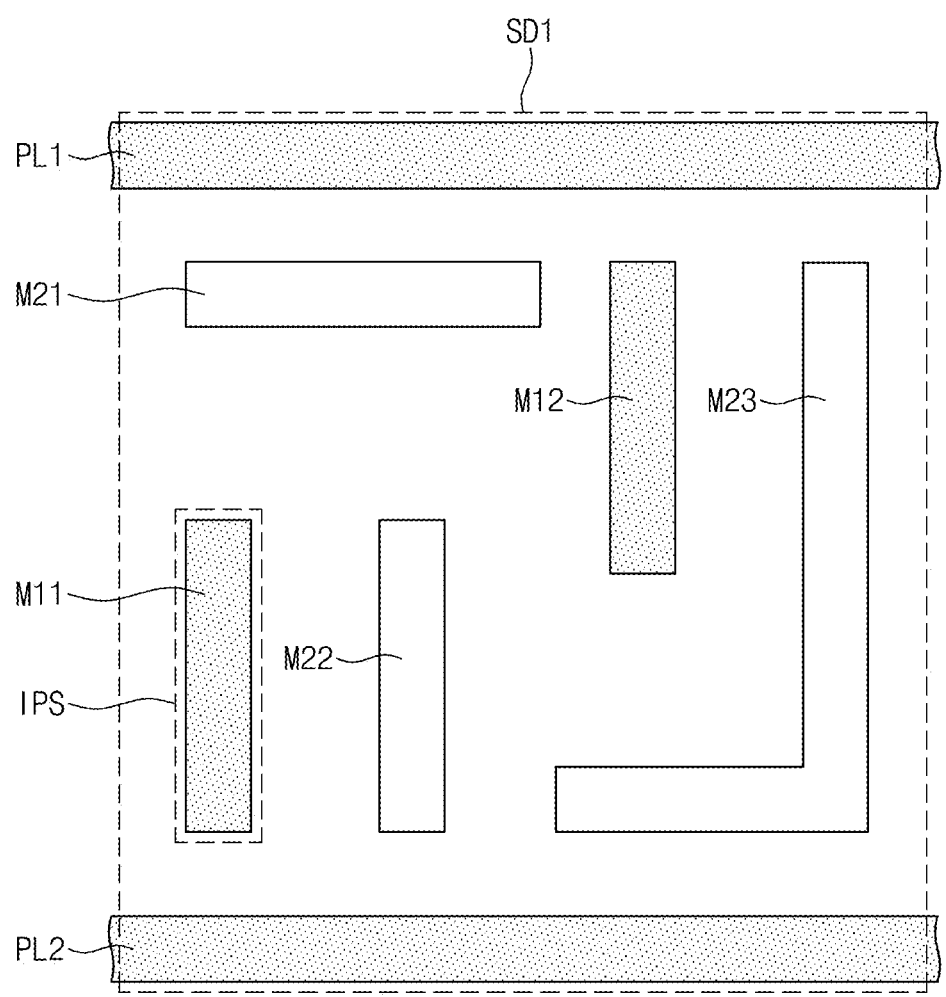
FIG. 19A, FIG. 19B, FIG. 20A, FIG. 20B, FIG. 21A, and FIG. 21B are plan views, which are provided to describe a process of connecting a power input pattern to a power pattern using the tie-connection operation illustrated in FIG. 18, and each of which illustrates layout patterns for a first metal layer.
Figure 19B:
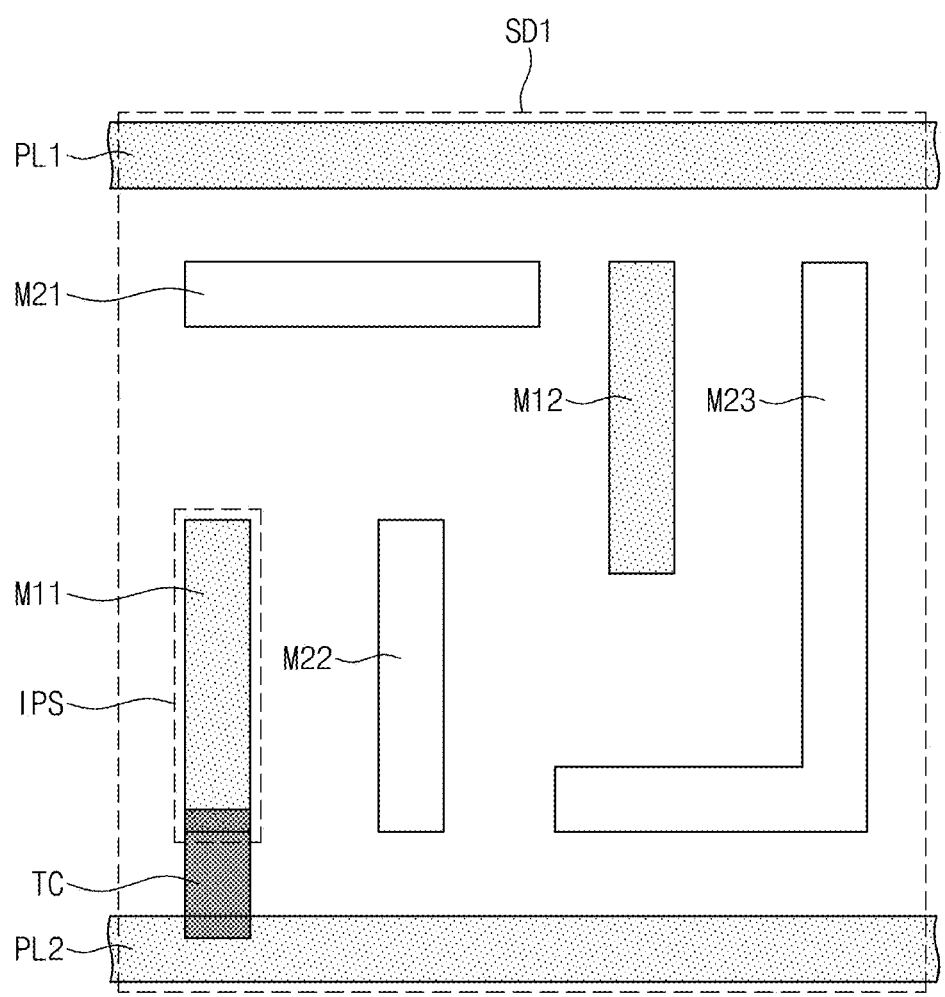

For example, FIG. 19A and FIG. 19B illustrate an example of the first standard cell SD1 described with reference to FIG. 15, FIG. 16A, FIG. 16B, FIG. 17A, and FIG. 17B. In some example embodiments the netlist may contain the information indicating that the first metal pattern M11 is an input pattern IPS to be connected to the second power pattern PL2. In this case, according to the information of M11 (PL2) contained in the back-annotation information, the first metal pattern M11 may be connected to the second power pattern PL2 through the tie-connection operation; for example, the tie-connection pattern TC may be between the first metal pattern M11 and the second power pattern PL2 may be selected.

Referring back to FIG. 18, if and/or when it is estimated from the back-annotation information that there is no tie-connection availability between the input pattern and the power pattern, the computer system 1 may replace the input pattern with another functionally-equivalent metal pattern. Thereafter, at S230, the computer system 1 may perform the back-annotation operation to examine tie-connection availability between the replaced input pattern and the power pattern. At S240, if and/or when the examined tie-connection availability is higher than a specific level, the computer system 1 may select a tie-connection pattern therebetween.

Figure 20A:
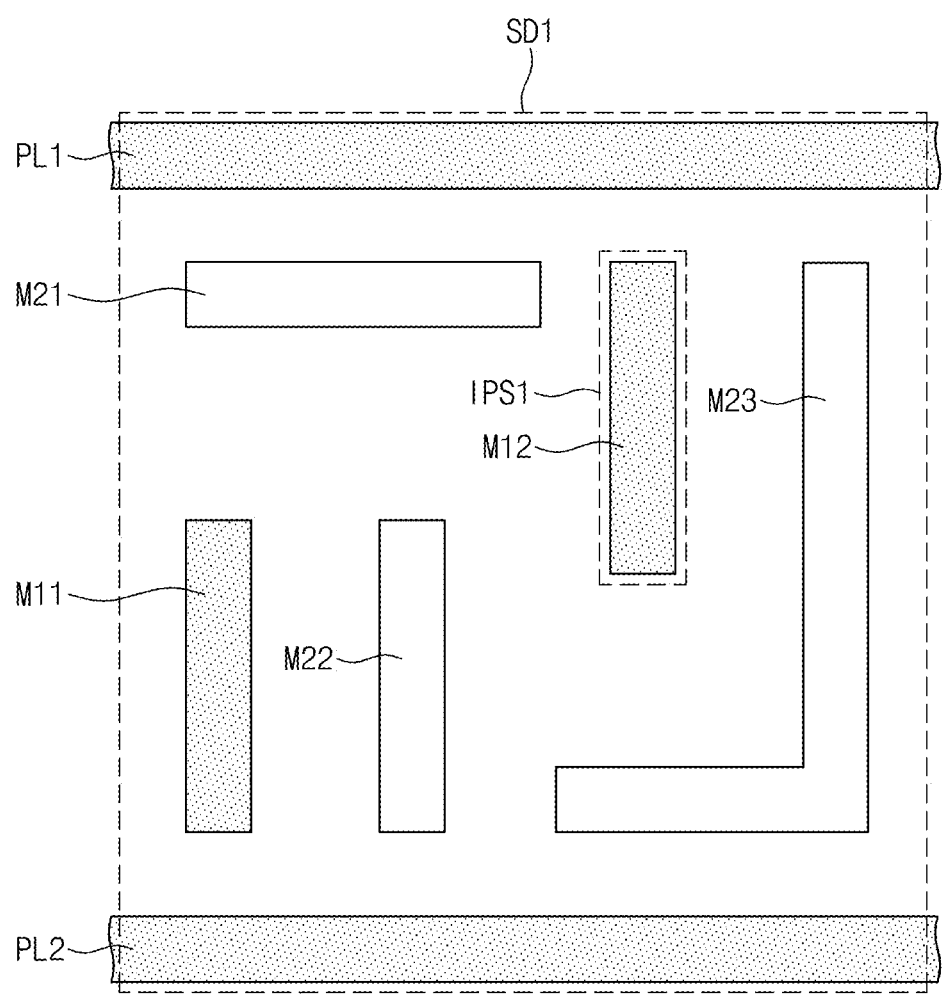
Figure 20B:
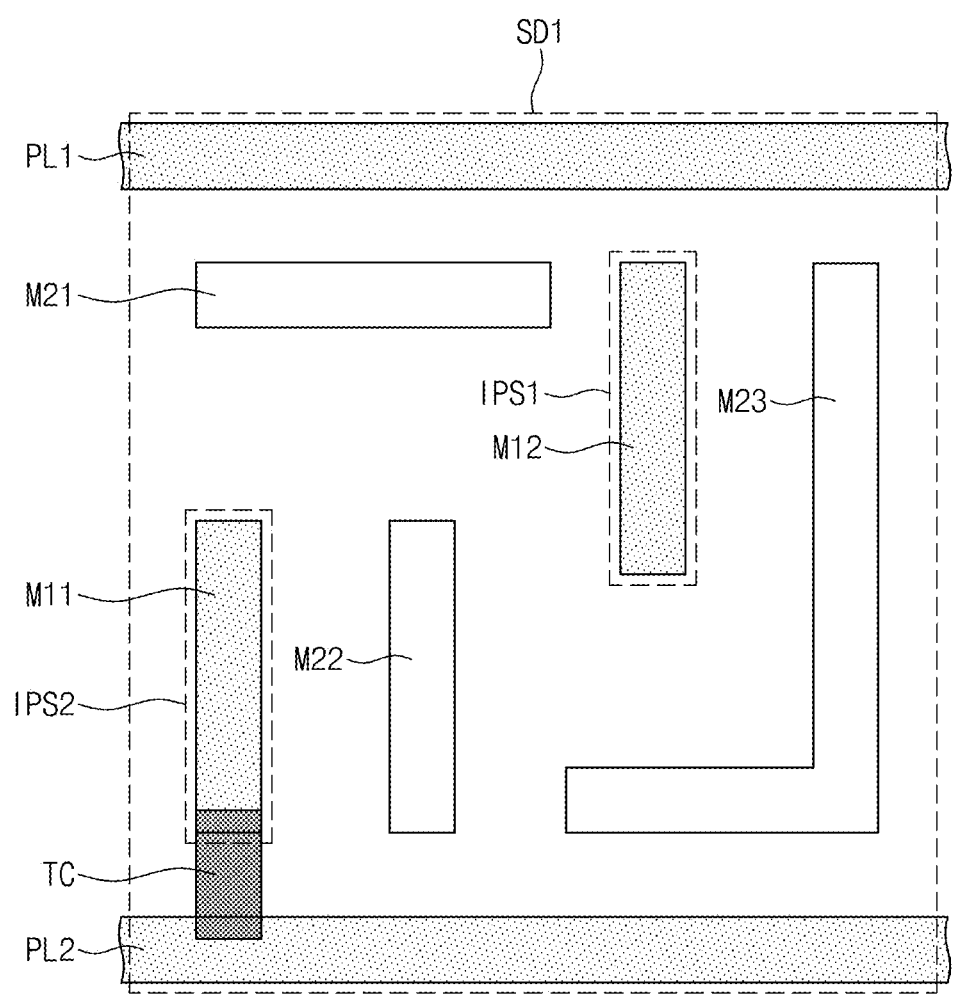

For example, FIG. 20A and FIG. 20B illustrate another example of the first standard cell SD1 previously described. Unlike the example embodiment illustrated in FIG. 19A and 19B, the netlist may contain the information indicating that the second metal pattern M12 is a first input pattern IPS1 to be connected to the second power pattern PL2.

The first standard cell SD1 may be configured in such a way that, instead of the second metal pattern M12, the first metal pattern M11 is connected to the second power pattern PL2, and in certain embodiments, in spite of this change, there may be no technical issue associated with function or performance of the cell. For example, in the case that the first standard cell SD1 is an AND logic circuit, the function of the first standard cell SD1 is not changed, even when input signals respectively applied to the input patterns M11 and M12 are interchanged with each other.

In this case, according to the information of M12 (PL1) contained in the back-annotation information, it is hard to connect the second metal pattern M12 to the second power pattern PL2 through the tie-connection operation, and thus, the tie-connection pattern TC may not be allowed to be therebetween. In some example embodiments a functionally-equivalent pattern (e.g., the first metal pattern M11) may be assigned to the second input pattern IPS2. In this case, since the information of M11 (PL2) is contained in the back-annotation information, the use of the back-annotation information may make it possible to properly select a tie-connection pattern TC that is between the first metal pattern M11 and the second power pattern PL2.

Referring back to FIG. 18, at S250, if and/or when there is no other functionally-equivalent metal pattern, the computer system 1 may convert the input pattern from the patterning group in which the power pattern initially included to another patterning group. Thereafter, at S260, the computer system 1 may perform the tie-connection operation between the input pattern, whose patterning group is changed, and the power pattern.

If and/or when it is estimated from the back-annotation information that the tie-connection operation between the input pattern and the power pattern violates the afore-described second and third design rules, it may be hard to perform the tie-connection operation therebetween. In this case, a second metal layer may be used to connect the input pattern to the power pattern (for example, according to a default value of the layout design tool). However, this may lead to an increase in length of a connection path between the input pattern and the power pattern.

Figure 21A:
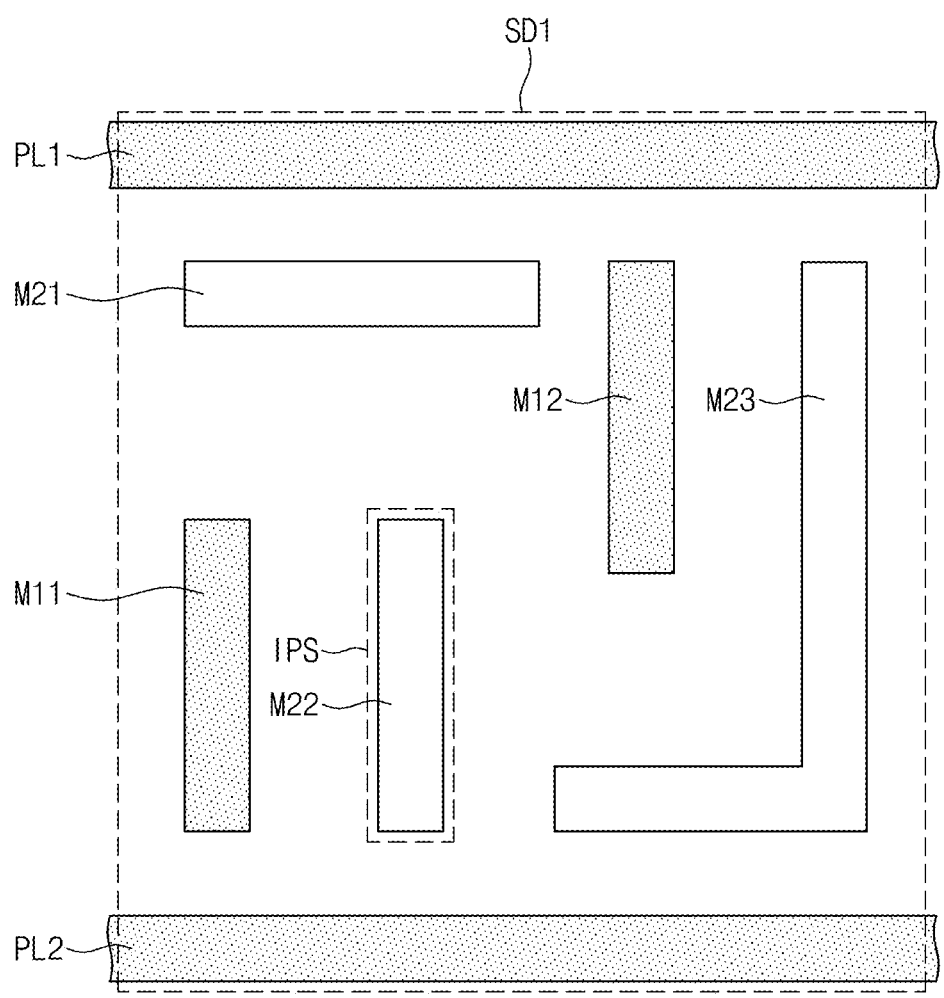
Figure 21B:
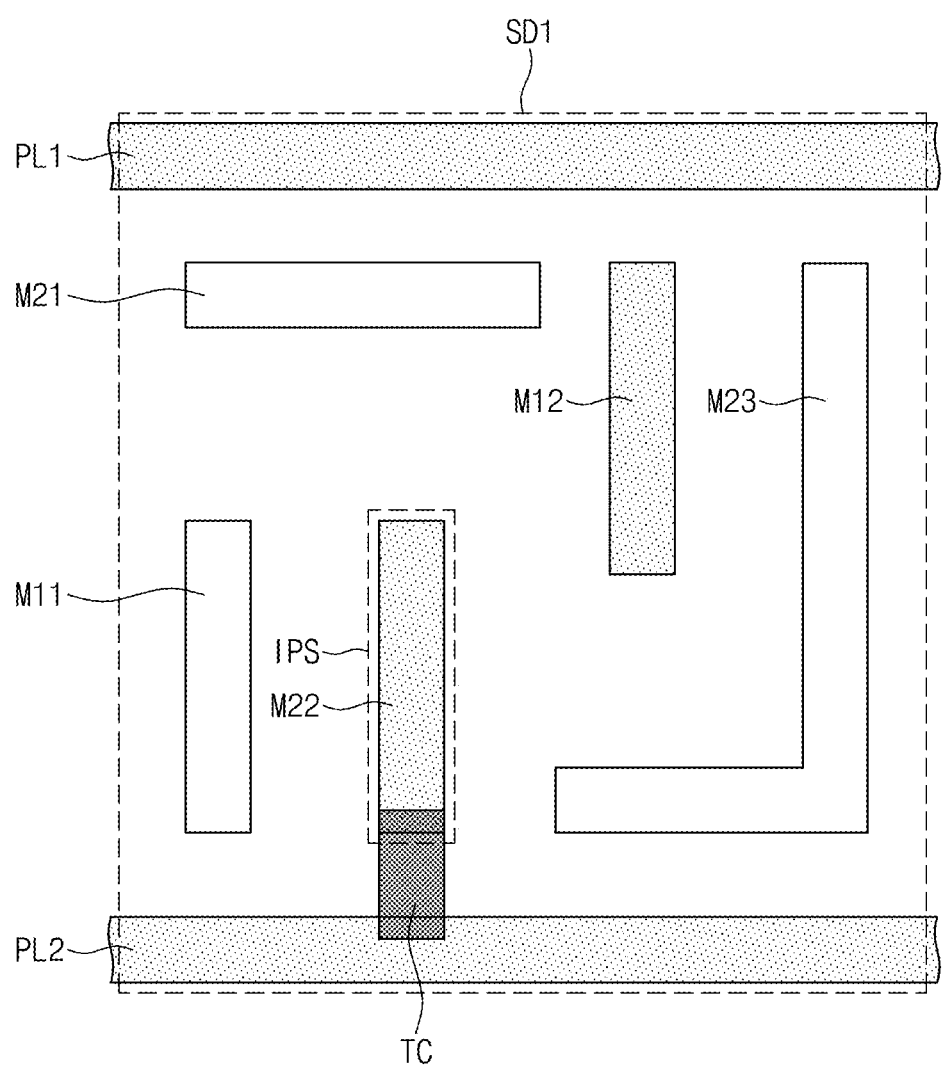

For example, FIG. 21A and FIG. 21B illustrate another example of the first standard cell SD1 previously described. Unlike the example embodiments illustrated in FIG. 19A, FIG. 19B, FIG. 20A, and FIG. 20B, the netlist may contain the information indicating that the fifth metal pattern M22 is an input pattern IPS to be connected to the second power pattern PL2.

In some example embodiments, it may be estimated from the back-annotation information that there is no tie-connection availability between the fifth metal pattern M22 and the second power pattern PL2. In addition, unlike the example embodiments illustrated in FIG. 20A and FIG. 20B, there may be no other functionally-equivalent metal pattern for replacing the fifth metal pattern M22.

In this case, for the fifth metal pattern M22 and the first metal pattern M11 adjacent thereto, except for the other metal patterns M12, M21, and M23 and the first and second power patterns PL1 and PL2, the patterning groups thereof may be exchanged. In other words, the fifth metal pattern M22 may be changed into the first patterning group and the first metal pattern M11 may be changed into the second patterning group. In some example embodiments, since the fifth metal pattern M22 and the second power pattern PL2 are included in the same patterning group (e.g., the first patterning group), the tie-connection pattern TC that may be located therebetween may be selected.

In the tie-connection method described with reference to FIG. 18, the use of the prepared back-annotation information may make it possible to select tie-connection patterns on a plurality of standard cells in an automated manner. Accordingly, it is possible to efficiently or quickly design a routing structure of a semiconductor device (e.g., logic chips) with many standard cells. In the case where the tie-connection pattern for at least one of the input patterns is not allowed under a given design rule, other metal layer (e.g., the second metal layer) may be used to establish the routing structure for such input pattern.

According to some example embodiments of the inventive concepts, a layout for a first metal layer may be used to manufacture a semiconductor device. The layout may be configured to include input and power patterns that are connected to each other through a tie-connection pattern. The selection of the tie-connection pattern may allow the input and power patterns to be connected to each other with a reduced routing distance (i.e., in a geodesic manner), and this may make it possible to improve performance or operation speed of a semiconductor device and to efficiently designing a routing path or a chip layout. Furthermore, by using back-annotation information, it is possible to automatically perform a tie-connection operation during the layout design process and consequently to efficiently or quickly design a routing structure of a semiconductor device (e.g., logic chips) with many standard cells.

While example embodiments of the inventive concepts have been particularly shown and described, it will be understood by one of ordinary skill in the art that variations in form and detail may be made therein without departing from the spirit and scope of the attached claims.

What is claimed is:
1. A method of manufacturing a semiconductor device, the method comprising:
  preparing a layout pattern, the preparing including:
    selecting a first power pattern and a second power pattern,
    selecting a first pattern and a second pattern between the first power pattern and the second power pattern, and
    selecting a tie-connection pattern connecting the first power pattern to the first pattern;

manufacturing a first photomask based on the first power pattern, the second power pattern, the first pattern, and the tie-connection pattern;

manufacturing a second photomask based on the second pattern; and forming one or more metal lines on a substrate according to the first photomask and the second photomask.

2. The method of claim 1, wherein, at least one of the metal lines includes a power interconnection portion, a metal interconnection portion, and a tie interconnection portion that are connected to form a single body; and a position and a shape of each of the power interconnection portion, the metal interconnection portion, and the tie interconnection portion is at least partially defined by the first power pattern, the first pattern, and the tie-connection pattern, respectively.

3. The method of claim 1, wherein the first pattern is configured to define an input pattern to which an input signal is applied.

4. The method of claim 1, wherein the tie-connection pattern includes a geodesic connection of the first power pattern to the first pattern.

5. The method of claim 1, wherein, the preparing the layout pattern further includes, preparing back-annotation information indicating tie-connection availability between the first pattern and the second pattern and the first power pattern and the second power pattern.

6. The method of claim 5, wherein, the preparing back-annotation information includes, identifying first preliminary tie-connection patterns configured to connect the first power pattern to the first pattern and the second pattern, respectively;

identifying second preliminary tie-connection patterns configured to connect the second power pattern to the first pattern and the second pattern, respectively; and excluding one of the first preliminary tie-connection patterns and the second preliminary tie-connection patterns from the back-annotation information based on a determination that the one of the first preliminary tie-connection patterns and the second preliminary tie-connection patterns violates at least one design rule.

7. The method of claim 5, wherein, the back-annotation information includes first information indicating that the first pattern is configured to be connected to the first power pattern by at least one tie-connection pattern; and said at least one tie-connection pattern is selected based on the first information.

8. The method of claim 5, wherein, the back-annotation information includes, first information indicating that the first pattern is configured to be connected to the first power pattern by at least one tie-connection pattern, and second information indicating that the second pattern is restricted from being connected to the first power pattern by at least one tie-connection pattern;

the first pattern and the second pattern are input patterns and are functionally equivalent to each other; and the selecting the tie-connection pattern includes, determining whether the second pattern is a first input pattern configured to be connected to the first power pattern, and selecting the tie-connection pattern to connect the first power pattern to the first pattern, based on the back-annotation information, such that the first pattern is assigned to a second input pattern, the second input pattern being functionally equivalent to the first input pattern.

9. The method of claim 5, wherein, the first power pattern and the second power pattern and the second pattern are included in a first patterning group associated with manufacturing the first photomask;

the first pattern is included in a second patterning group associated with manufacturing the second photomask;

the back-annotation information indicating that the first pattern is restricted from being connected to the first power pattern by at least one tie-connection pattern; and the selecting the tie-connection pattern includes, determining whether the first pattern is an input pattern configured to be connected to the first power pattern, converting the first pattern from the second patterning group to the first patterning group, based on the back-annotation information, and converting the second pattern from the first patterning group to the second patterning group, based on the back-annotation information.

10. The method of claim 1, prior to the forming one or more metal lines, further comprising:

patterning the substrate to define an active pattern;

forming a gate pattern that crosses the active pattern; and forming a source region and a drain region on the active pattern and at opposite sides of the gate pattern, wherein at least two of the metal lines are electrically connected to the gate pattern, the source region and the drain region, respectively.

11. A method of manufacturing a semiconductor device, the method comprising:

preparing a layout pattern for a first metal layer, the preparing including:

selecting a pair of power patterns, selecting a plurality of patterns between the pair of power patterns, selecting a tie-connection pattern to connect at least one power patterns of the pair of the power patterns to at least one pattern of the plurality of patterns, and assigning the pair of the power patterns, the at least one patterns, and the tie-connection pattern to a first patterning group; and forming metal lines on a substrate, the metal lines having positions and shapes defined by the layout pattern for the first metal layer.

12. The method of claim 11, wherein, the forming the metal lines includes performing a patterning process according to a first photomask and a second photomasks; and the first photomask is manufactured based on the first patterning group.

13. The method of claim 11, wherein, the preparing the layout pattern for the first metal layer further includes, preparing back-annotation information indicating tie-connection availability between the plurality of patterns and the pair of power patterns.

14. The method of claim 13, wherein, the selecting the tie-connection pattern includes, determining a connection relationship criterion, based on the back-annotation information; and selecting the tie-connection pattern if a connection relationship between an input pattern of the plurality of patterns and the pair of power patterns at least meets the connection relationship criterion.

15. The method of claim 13, wherein,
the selecting the tie-connection pattern includes,
determining a connection relationship criterion, based on the back-annotation information; and
if a connection relationship of an input pattern of the plurality of patterns does not meet the connection relationship criterion, performing at least one of,
replacing the input pattern with another pattern of the plurality of patterns, and
assigning the input pattern to the first patterning group.

16. A method of manufacturing a semiconductor device, the method comprising:
forming at least one insulating layer on a substrate;
forming at least a first set and a second sets of metal interconnection holes in the at least one insulating layer according to separate, respective a first patterning group and a second patterning group; and
filling the first set and the second set of metal interconnection holes with at least one conductive material to form metal lines according to the first patterning group and the second patterning group;
the first patterning group including:
a first power pattern and a second power pattern,
a first pattern between the first power pattern and the second power pattern, and
a tie-connection pattern configured to connect the first power pattern to the first pattern; and
the second patterning group including:
a second pattern between the first power pattern and the second power pattern.

17. The method of claim 16, further comprising:
forming the first set and the second set of metal interconnection holes according to a first photomask and a second photomask, the first photomask being based on the first patterning group, the second photomask being based on the second patterning group.

18. The method of claim 16, wherein,
at least one of the metal lines includes a power interconnection portion, a metal interconnection portion, and a tie interconnection portion that are connected to form a single body; and
a position and a shape of each of the power interconnection portion, the metal interconnection portion, and the tie interconnection portion is at least partially defined by the first power pattern, the first pattern, and the tie-connection pattern, respectively.

19. The method of claim 16, wherein the first pattern is configured to define an input pattern to which an input signal is applied.

20. The method of claim 16, wherein,
the tie-connection pattern includes a geodesic connection of the first power pattern to the first pattern.

* * * * *